United States Patent
Shukla et al.

(10) Patent No.: US 8,212,243 B2
(45) Date of Patent: Jul. 3, 2012

(54) ORGANIC SEMICONDUCTING COMPOSITIONS AND N-TYPE SEMICONDUCTOR DEVICES

(75) Inventors: Deepak Shukla, Webster, NY (US); Dianne M. Meyer, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 245 days.

(21) Appl. No.: 12/691,793

(22) Filed: Jan. 22, 2010

(65) Prior Publication Data

US 2011/0180784 A1 Jul. 28, 2011

(51) Int. Cl.
*H01L 51/30* (2006.01)

(52) U.S. Cl. ........... 257/40; 257/E51.006; 257/E51.027; 257/E51.024; 257/E51.002; 257/E51.025

(58) Field of Classification Search ............... 257/40, 257/E51.006, E51.027, E51.024, E51.002, 257/E51.025
See application file for complete search history.

(56) References Cited

U.S. PATENT DOCUMENTS

| | | | |
|---|---|---|---|
| 3,963,498 A | 6/1976 | Trevoy | |
| 5,625,199 A | 4/1997 | Baumbach et al. | |
| 6,653,510 B1 | 11/2003 | Brown et al. | |
| 7,029,945 B2 | 4/2006 | Veres et al. | |
| 7,095,044 B2 | 8/2006 | Brown et al. | |
| 7,244,960 B2 | 7/2007 | Spreitzer et al. | |
| 7,332,369 B2 | 2/2008 | Veres et al. | |
| 7,422,777 B2 * | 9/2008 | Shukla et al. | 428/1.1 |
| 7,576,208 B2 | 8/2009 | Brown et al. | |
| 7,579,619 B2 * | 8/2009 | Shukla et al. | 257/40 |
| 7,586,080 B2 | 9/2009 | Chabinyc et al. | |
| 2004/0038459 A1 | 2/2004 | Brown et al. | |
| 2004/0043531 A1 * | 3/2004 | Cheng et al. | 438/99 |
| 2005/0104058 A1 | 5/2005 | Veres et al. | |
| 2008/0009625 A1 | 1/2008 | Brown et al. | |
| 2008/0135833 A1 * | 6/2008 | Shukla et al. | 257/40 |
| 2009/0256137 A1 | 10/2009 | Shukla et al. | |
| 2011/0183462 A1 * | 7/2011 | Shukla et al. | 438/99 |
| 2011/0266523 A1 * | 11/2011 | Shukla et al. | 257/40 |
| 2011/0269265 A1 * | 11/2011 | Shukla et al. | 438/99 |
| 2011/0269966 A1 * | 11/2011 | Shukla et al. | 546/99 |
| 2011/0269967 A1 * | 11/2011 | Shukla et al. | 546/110 |

FOREIGN PATENT DOCUMENTS

| | | |
|---|---|---|
| EP | 1 340 270 | 1/2007 |
| EP | 1 783 781 | 5/2007 |
| EP | 1 808 866 | 7/2007 |
| EP | 1 807 884 | 7/2008 |
| WO | 2004/057688 | 7/2004 |

* cited by examiner

*Primary Examiner* — Victor A Mandala
(74) *Attorney, Agent, or Firm* — J. Lanny Tucker

(57) ABSTRACT

An organic semiconducting composition consists essentially of an N,N-dicycloalkyl-substituted naphthalene diimide and a polymer additive comprising an insulating or semiconducting polymer having a permittivity at 1000 Hz of at least 1.5 and up to and including 5. This composition can be used to provide a semiconducting layer in a thin-film transistor that can be incorporated into a variety of electronic devices.

12 Claims, 1 Drawing Sheet

ORGANIC SEMICONDUCTING COMPOSITIONS AND N-TYPE SEMICONDUCTOR DEVICES

FIELD OF THE INVENTION

The present invention relates to the use of certain N,N'-dicycloalkyl-substituted naphthalene diimide compounds with polymeric additives in organic semiconducting layers and compositions that can be used in various n-type electronic devices such as thin film transistors and integrated circuits.

BACKGROUND OF THE INVENTION

Thin film transistors ("TFT's") are widely used as switching elements in electronics, for example, in active-matrix liquid-crystal displays, smart cards, and a variety of other electronic devices and components thereof. The thin film transistor (TFT) is an example of a field effect transistor ("FET"). The best-known example of an FET is the "MOS-FET (Metal-Oxide-Semiconductor-FET) that can be used for high-speed applications. Most thin film devices are made using amorphous silicon as the semiconductor because amorphous silicon is a less expensive alternative to crystalline silicon. This fact is especially important for reducing the cost of transistors in large-area applications. Application of amorphous silicon is limited to low speed devices, however, since its maximum mobility (0.5-1.0 $cm^2/V \cdot sec$) is about a thousand times smaller than that of crystalline silicon.

The use of amorphous silicon has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

More recently, organic materials have received attention as a potential alternative to amorphous silicon for use in semiconductor channels of TFT's. Organic semiconductor materials are simpler to process, especially those that are soluble in organic solvents and, therefore, capable of being applied to large areas by far less expensive processes, such as spin-coating, dip-coating and microcontact printing. Furthermore, organic materials may be deposited at lower temperatures, opening up a wider range of substrate materials, including plastics, for flexible electronic devices. Accordingly, thin film transistors made of organic materials can be viewed as a potential key technology for plastic circuitry or devices where ease of fabrication or moderate operating temperatures are important considerations or mechanical flexibility of the product is desired.

Organic semiconductor materials can be used in TFT's to provide the switching or logic elements in electronic components, many of which require significant mobilities, well above 0.01 $cm^2/V \cdot sec$, and current on/off ratios (hereinafter referred to as "on/off ratios") greater than 1000. Organic TFT's having such properties are capable of use for electronic applications such as pixel drivers for displays, identification tags, portable computers, pagers, memory elements in transaction carts, and electronic signs. Organic materials for use as potential semiconductor channels in TFTs are disclosed, for example, in U.S. Pat. No. 5,347,144 (Garnier et al.).

Considerable efforts have been made to discover new organic semiconductor materials that can be used in FET's to provide switching or logic elements in electronic components, many of which require significant mobilities well above 0.01 $cm^2/V \cdot sec$, and current on/off ratios (hereinafter referred to as "on/off ratios") greater than 1000. Organic FETs ("OFET's") having such properties can be used for electronic applications such as pixel drivers for displays and identification tags. Most of the compounds exhibiting these desirable properties are "p-type" or "p-channel," however, meaning that negative gate voltages, relative to the source voltage, are applied to induce positive charges (holes) in the channel region of the device.

As an alternative to p-type organic semiconductor materials, n-type organic semiconductor materials can be used in FET's where the terminology "n-type" or "n-channel" indicates that positive gate voltages, relative to the source voltage, are applied to induce negative charges in the channel region of the device.

Moreover, one important type of FET circuit, known as a complementary circuit, requires an n-type semiconductor material in addition to a p-type semiconductor material. In particular, the fabrication of complementary circuits requires at least one p-channel FET and at least one n-channel FET. Simple components such as inverters have been realized using complementary circuit architecture. Advantages of complementary circuits, relative to ordinary FET circuits, include lower power dissipation, longer lifetime, and better tolerance of noise. In such complementary circuits, it is often desirable to have the mobility and the on/off ratio of an n-channel device similar in magnitude to the mobility and the on/off ratio of a p-channel device. Hybrid complementary circuits using an organic p-type semiconductor and an inorganic n-type semiconductor are known, but for ease of fabrication, an organic n-channel semiconductor material would be desired in such circuits.

Only a limited number of organic materials have been developed for use as a semiconductor n-channel in OFET's. One such material, buckminsterfullerene C60, exhibits a mobility of 0.08 $cm^2/V \cdot sec$ but it is considered unstable in air (Haddon et al. *Appl. Phys. Let.* 1995, 67, 121). Perfluorinated copper phthalocyanine has a mobility of 0.03 $cm^2/V \cdot sec$ and is generally stable to air operation, but substrates must be heated to temperatures above 100° C. in order to maximize the mobility in this material (Bao et al. *Am. Chem, Soc.* 1998, 120, 207). Other n-channel semiconductors, including some based on a naphthalene framework, have also been reported, but with lower mobilities. One such naphthalene-based n-channel semiconductor material, tetracyanonaphthoquinodimethane (TCNNQD), is capable of operation in air, but the material has displayed a low on/off ratio and is also difficult to prepare and purify.

Aromatic tetracarboxylic diimides, based on a naphthalene aromatic framework, have also been demonstrated to provide, as an n-type semiconductor, n-channel mobilities up to 0.16 $cm^2/V \cdot sec$ using top-contact configured devices where the source and drain electrodes are on top of the semiconductor. Comparable results could be obtained with bottom contact devices, that is, where the source and drain electrodes are underneath the semiconductor, but a thiol underlayer must then be applied between the electrodes (that must be gold) and the semiconductor as described in U.S. Pat. No. 6,387,727 (Katz et al.). In the absence of the thiol underlayer, the mobility of these compounds was found to be orders of magnitude lower in bottom-contact devices. This patent also discloses fused-ring tetracarboxylic diimide compounds, one example of which is N,N'-bis(4-trifluoromethyl benzyl)naphthalene diimide. The highest mobilities of 0.1 to 0.2 $cm^2/V \cdot sec$ were reported for N,N'-dioctyl naphthalene diimide.

In a different study, using pulse-radiolysis time-resolved microwave conductivity measurements, relatively high mobilities have been measured in films of naphthalene diimides having linear alkyl side chains (Struijk et al., *J. Am. Chem. Soc.* Vol. 2000, 122, 11057).

U.S. Patent Application Publication 2002/0164835 (Dimitrakopoulos et al.) discloses n-channel semiconductor films made from perylene diimide compounds, as compared to naphthalene-based compounds, one example of which is N,N'-di(n–1H,1H-perfluorooctyl) perylene diimide. Substituents attached to the imide nitrogens in the diimide structure comprise alkyl chains, electron deficient alkyl groups, and electron deficient benzyl groups, and the chains preferably having a length of four to eighteen atoms. Devices based on materials having a perylene framework used as the organic semiconductor have low mobilities, for example $10^{-5}$ cm$^2$/V·sec for perylene tetracarboxylic dianhydride (PTCDA) and $1.5 \times 10^{-5}$ cm$^2$/V·sec for N,N'-diphenyl perylene diimide (PTCDI-Ph) (Horowitz et al. *Adv. Mater.* 1996, 8, 242 and Ostrick et al. *J. Appl. Phys.* 1997, 81, 6804).

The morphology of an organic film has a strong impact on the charge transport and overall device performance of organic thin film transistors. In general, the morphology of organic films depends directly on the chemical structure of the molecules that controls the interaction between the molecules. In crystalline organic films defects, like grain boundaries and disorder inside the grains, are limiting factors for the mobility and the diffusion length of the charge carriers. The extent of π-stacking between the molecules determines whether the organic film will be highly crystalline or totally amorphous independently of other growth controlling parameters like the substrate and its temperature.

In perylene and naphthalene diimide based OFET's, many experimental studies have demonstrated that morphology of the thin film has strong impact on the device performances. Theoretical calculation and experimental characterization (particularly X-ray diffraction), have shown that the molecular packing in PDI is very sensitive to the side chains (Kazmaier et al. *J. Am. Chem. Soc.* 1994, 116, 9684). In perylene diimide based n-channel OFET devices, changing the side chain from n-pentyl to n-octyl increases the field effect mobility of from 0.055 cm$^2$/V·sec to 1.3 cm$^2$/V·sec, respectively (Chesterfield et al. *J. Phys. Chem. B* 2004, 108, 19281). Such sensitivity to the type of side-chain is a manifestation of an aggregation effect and it provides potentially an effective way to control and optimize the molecular packing for enhanced π-orbital overlap between neighboring molecules, a necessary for efficient carrier transport. U.S. Pat. No. 7,422,777 (Shukla et al.) discloses N,N'-dicycloalkyl-substituted naphthalene diimide compounds, which in thin films, exhibit optimum packing and exhibit n-channel mobility up to 6 cm$^2$/V·sec in OFET's. U.S. Pat. No. 7,579,619 (Shukla et al.) discloses N,N'-di(arylalkyl) substituted naphthalene diimide compounds that exhibit high n-channel mobility up to 3 cm$^2$/V·sec in top-contact OFET's.

U.S. Patent Application Publications 2008/0135833 (Shukla et al.) and 2009/0256137 (Shukla et al.) describe n-type semiconductor materials for thin film transistors that include configurationally controlled N,N'-dicycloalkyl-substituted naphthalene 1,4,5,8-bis-carboximide compounds or N,N'-1,4,5,8-naphthalenetetracarboxylic acid imides having a fluorinated substituent, respectively.

As discussed above, a variety of naphthalene diimides have been made and tested for n-type semiconducting properties. In general, these materials, as an n-type semiconductor, have provided n-channel mobilities up to 6 cm$^2$/V·sec using top-contact configured devices. However, besides charge mobility, improved stability and integrity of the semiconductor layer is an important goal. A way to improve organic semiconductor layer stability and integrity in a device would be to include the organic semiconductor molecule in a polymeric additive. However, the performance of OFET's, characterized by parameters such as the field effect mobility and threshold voltage, depends in part upon the molecular structure and crystalline order of the semiconductor film. Structure and molecular ordering of the semiconductor film depends in turn on how the thin film is deposited. It is generally believed that increasing the amount of molecular order by increasing crystal size, reducing the density of crystalline defects, or improving short-range molecular order, permits charge carriers, that is, electrons or holes, to more efficiently move between molecules. This can increase the field effect mobility.

Advantageous molecular order that gives high field effect mobility can be achieved using some relatively expensive deposition techniques. In contrast, deposition techniques that enable inexpensive production or production of films of a desired uniformity and thickness can produce films that exhibit relatively small field-effect mobility. For example, a solvent cast film that is permitted to slowly dry often exhibits relatively high field effect mobility when incorporated into an OFET. Unfortunately, some deposition techniques that are more amenable to manufacturing do not readily permit slow evaporation of solvent. For example, though spin coating can yield relatively uniform thin films, the solvent usually leaves the film relatively quickly, generally leading to a low degree of crystal order. Field-effect mobility, for example, can be a factor of about 10 to 100 smaller than for cast films. Other manufacturing processes such as screen printing or various thin-film coating methods may yield desirable film morphology, but not a desirable molecular order.

The addition of polymeric additive in solvent cast semiconductor films could solve some of the aforementioned problems. The addition of a polymer in coating solvent could provide a better control over the semiconductor film morphology by acting as a plasticizer during thermal annealing process. Furthermore, if an added polymer phase segregates away from the semiconductor-dielectric interface it could also increase the ambient operational stability of devices. However, the addition of a polymer could disrupt the molecular ordering in the semiconducting layer that could leads to disruption of the orbital overlap between molecules in the immediate vicinity of the gate insulator leading to reduced mobility. Electrons or holes are then forced to extend their path into the bulk of the organic semiconductor, which is an undesirable result. Certain organic semiconducting materials are expected to be more susceptible than others to the effects of added polymer.

EP 910,100 (Hsieh) describes compositions for conductive coatings comprising a polymer binder, charge transport molecules, and an oxidant that is used to increase carrier concentration. Such coatings may be useful as conductive electrodes for electronic devices, such as source-drain and gate electrodes in FET's.

U.S. Pat. No. 5,500,537 (Tsumura et al.) describes FET's with at least two different organic channel materials, both of which are semiconductors. The application also mentions that a further "electrically insulating material" can be mixed in but does not teach what such material may be or how it is applied.

EP 478,380 (Miura et al.) describes organic thin films comprising of mixed charge-transfer complexes of donor and acceptor materials. The complex thin film can be affected to change its state from neutral to ionic by the application of an electric field. When used in a FET, the transition leads to an abrupt change in the carrier density in the channel. Multi-stack channels are also described using several double-layers of a charge transfer complex layer followed by an insulating poly(vinylidene fluoride) (PVDF) layer. The insulating PVDF layer is not used as a binder.

U.S. Pat. No. 5,625,199 (Baumbach et al.) discloses complementary circuits with p- and n-type OFET's. It also mentions that p-type organic material may be made of p,p'-diaminobisphenyl in polymer matrices. However, there is no teaching of the use of polymer matrices with n-type organic materials or what polymer matrix may be and does not disclose any other compound other than p,p'-diaminobisphenyl.

U.S. Pat. No. 3,963,498 (Trevoy) discloses amine salts of linear polyanilines as useful semiconductors. It further discloses that an organic binder may be added to the amine salt.

Certain low polarity polymeric additives are described in U.S. Pat. No. 7,095,044 (Brown et al.) for use with organic semiconductors in FET's. This patent discloses an OFET structure in which the semiconductor layer comprises an organic semiconductor and a polymeric binder that has an inherent conductivity of less than $10^{-6}$ S cm$^{-1}$ and a permittivity at 1,000 Hz of less than 3.3. The patent does not specifically teach how to use polymer binders with n-type materials, such as naphthalene diimide based n-type semiconductor materials.

WO 2004/057688 (Veres et al.) discloses compositions for use as organic semiconducting materials in which a low molecular weight semiconducting material is mixed with higher molecular weight organic semiconducting material. One composition comprises at least one higher molecular weight organic semiconducting compound having a number average molecular weight ($M_n$) of at least 5000 and at least one lower molecular weight compound having a number average molecular weight ($M_n$) of 1000 or less. The polymeric binder is a semiconductor as well. However, there is no teaching about how to use n-type organic semiconducting materials, such as naphthalene diimides, with polymeric binders.

U.S. Pat. No. 7,576,208 (Brown et al.) describes the use of low polarity binders in polyacene-based semiconductors.

U.S. Pat. No. 7,586,080 (Chabinyc et al.) discloses a layered structure comprising a carrier-transporting substructure. The carrier-transporting substructure includes at least one of polymer material, blends of polymers, or polymerized organic compounds. Furthermore, the carrier-transporting substructure includes one or more of titanyl phthalocyanine, poly(vinyl butyral), poly(9,9-dioctylfluorene-alt-benzothiadiazole) (F8BT), N,N'-diphenyl-N,N'bis(3-methylphenyl)-(1-1'-biphenyl)-4,4'-diamine (TPD), and alkylated-4,-4'diphenoquinones (DPQ).

U.S. Pat. No. 7,244,960 (Spreitzer et al.) discloses solutions of organic semiconductors containing one or more additives that can be organic compounds containing the heteroatom silicon, germanium, or fluorine, or an amphiphile and wherein at least one additive is an organic siloxane-containing compound.

As described above, most of the semiconductor layer compositions described in the art are p-type and similar n-type semiconductor layer formulations are not well known. As development of advanced circuits (for example, complementary circuits) requires both p- and n-type semiconductors there is a need to develop n-type semiconductor layer formulations. There is a need for n-type semiconducting layer composition that is easily processed and provides control over the film morphology. An additional problem in development of robust n-type semiconductors is their operational stability. In contrast to p-type materials, device performance of n-type semiconductors is degraded in the presence of atmospheric oxidants such as $O_2$ and $H_2O$. Electronically this susceptibility manifests itself in the formation of efficient electron traps or the sharp degradation of carrier mobility upon exposure to air. Another need is to develop n-type layer composition that is less susceptible to the ambient and minimizes the deterioration of electronic properties over time.

SUMMARY OF THE INVENTION

The present invention provides an organic semiconducting composition consisting essentially of an N,N-dicycloalkyl-substituted naphthalene diimide and a polymer additive comprising an insulating or semiconducting polymer having a permittivity at 1000 Hz of at least 1.5 and up to and including 5.

The invention also provides an organic semiconducting layer on a suitable substrate, which layer consists essentially of the organic semiconducting layer composition (or formulation) of this invention.

In addition, an article comprises a support having disposed thereon a dry organic semiconducting layer consisting essentially of an N,N-dicycloalkyl-substituted naphthalene diimide and a polymer additive comprising an insulating or semiconducting polymer having a permittivity at 1000 Hz of at least 1.5 and up to and including 5.

This invention also provides a thin-film, field-effect transistor comprising a dielectric layer, a gate electrode, a source electrode, a thin film of an organic semiconducting composition, and a drain electrode, wherein the dielectric layer, the gate electrode, the thin film of organic semiconductor material, source electrode, and the drain electrode are in any sequence as long as the gate electrode and thin film of the organic semiconducting composition both contact the dielectric layer, and the source electrode and the drain electrode both contact the thin film of the organic semiconducting composition, wherein the thin film of organic semiconductor consists essentially of an N,N-dicycloalkyl-substituted naphthalene diimide and a polymer additive comprising an insulating or semiconducting polymer having a permittivity at 1000 Hz of at least 1.5 and up to and including 5.

Further, an electronic device of this invention is selected from the group consisting of integrated circuits, active-matrix display, and solar cells comprising a multiplicity of thin-film transistors according to this invention. This electronic device can have the multiplicity of the thin-film transistors on a non-participating support that is optionally flexible.

An integrated circuit can comprise a plurality of thin-film transistors made by this process.

The present invention includes the use of certain N,N'-dicycloalkyl-substituted naphthalene diimide compounds in combination with certain polymeric additive. This combination of materials exhibits superior performance in devices such as n-type semiconducting materials and devices.

Advantageously, an n-channel thin film organic semiconducting composition or layer used in a transistor device according to the present invention does not necessarily require, for obtaining high mobilities, prior treatment of the first and second contact means connected to the film. Furthermore, the naphthalene diimide compounds used in the present invention possess significant volatility so that vapor phase deposition, where desired, is available to apply the n-channel organic semiconductor films to a substrate in an organic thin film transistor.

The presence of certain polymeric additives that have a permittivity of at least 1.5 and up to and including 5 provides better control over thin film morphology and enhances operational stability of OFET devices comprising such an inventive layer. The addition of a polymer in coating solvent provides a better control over the semiconductor film morphology by acting as a plasticizer during thermal annealing process. Furthermore, as the added polymer phase segregates away from the semiconductor-dielectric interface it also increase the ambient operational stability of devices.

The present invention and its advantages will become more apparent when taken in conjunction with the following description, drawings, and the illustrative working examples provided below.

BRIEF DESCRIPTION OF THE DRAWINGS

FIGS. 1a and 1b have a bottom gate configuration and FIGS. 1c and 1d have a top gate configuration

DETAILED DESCRIPTION OF THE INVENTION

Definitions

Figure 1A:
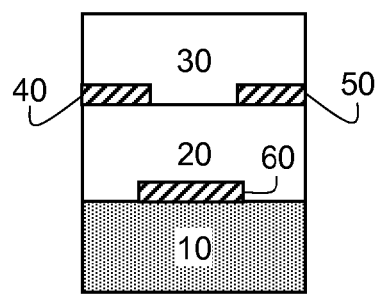
FIGS. 1a through 1d illustrate cross-sectional views of four possible configurations for an organic field effect transistor of the present invention.

As used herein, "a" or "an" or "the" are used interchangeably with "at least one," to mean "one or more" of the components or elements being defined. For example, mixtures of naphthalene diimides or polymer additives can be used in the organic semiconductor compositions of this invention.

As used herein, the terms "over," "above," and "under" and the like, with respect to layers in the organic thin film transistor, refer to the order of the layers wherein the organic thin film layer is above the gate electrode, but do not necessarily indicate that the layers are immediately adjacent or that there are no intermediate layers.

The terms "polymer additive" and "polymer binder" are meant to be the same for this invention.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituents unsubstituted form, but also its form to the extent it can be further substituted (up to the maximum possible number) with any other mentioned substituent group or groups (mentioned for the same position) so long as the substituent does not destroy properties necessary for semiconductor utility. If desired, the substituents may themselves be further substituted one or more times with acceptable substituent groups. For example, an alkyl group can be substituted with an alkoxy group or one or more fluorine atoms, in the case of $R^4$ or $R^8$ noted below, or other R groups (optional additional substituents in the secondary alicyclic ring, four additional R groups in the case where the secondary alicyclic ring is a cyclohexyl ring) or in the case of a Y group as described below. When a molecule may have two or more substituents, the substituents may be joined together to form an aliphatic or unsaturated ring unless otherwise provided.

With respect to the various R groups or Y groups, examples of any of the above-mentioned alkyl groups are methyl, ethyl, propyl, isopropyl, butyl, isobutyl, t-butyl, pentyl, hexyl, octyl, 2-ethylhexyl, and isomers thereof. Alkyl groups generally have 1 to 10 carbon atoms or typically 1 to 6 carbon atoms and include both branched and linear groups. Similarly, alkenyl groups can be vinyl, 1-propenyl, 1-butenyl, and 2-butenyl as well as linear or branched isomers thereof.

With respect to Y groups (described below), aryl groups can be phenyl, naphthyl, styryl, and isomers thereof. Arylalkyl groups can be benzyl, phenethyl, and isomers thereof. Any of the Y groups can be substituted as a skilled artisan would understand is possible from the teaching provided herein.

Organic Semiconducting Compositions and Layers

The n-channel organic semiconducting layer used in the present invention comprises one or more of the N,N'-cycloalkyl-substituted naphthalene diimide compounds described herein, and one or more polymer additives. This layer is capable of exhibiting a field effect electron mobility that is greater than 0.001 $cm^2$/V·sec or typically that is greater than 0.1 $cm^2$/V·sec. In many useful embodiments, the organic semiconducting layers exhibit a field effect electron mobility that is greater than 0.25 $cm^2$/V·s.

In addition, the n-channel organic semiconducting layer is capable of providing on/off ratios of a source/drain current of at least $10^4$ or typically of at least $10^5$. The on/off ratio is measured as the maximum/minimum of the drain current as the gate voltage is swept from zero to 100 volts and the drain-source voltage is held at a constant value of 100 volts, and employing a gate dielectric.

Moreover, these properties are attainable after repeated exposure of the n-type organic semiconducting layer to air before layer deposition as well as exposure of the transistor device or the channel layer to air after layer deposition.

Without wishing to be bound by theory, there are several factors that are believed to contribute to the desirable properties of the organic semiconducting layer used in the present invention. Even in the presence of the polymer additive, the solid-state structure of the naphthalene diimide compounds described herein exhibit good order in the layer. The molecules are packed such that the orbitals of the conjugated naphthalene core system containing the naphthalene ring system or the imide carboxyl groups are able to interact with adjacent molecules, resulting in high mobility. The direction of this interaction has a component parallel to the direction of desired current flow in a device using this material as the semiconducting layer. The morphology of the layer formed by naphthalene diimides and polymer additive is substantially continuous such that current flows through the material without unacceptable interruption.

The lowest lying unoccupied molecular orbital of the naphthalene diimide compound is at an energy that allows for injection of electrons in the compound at useful voltages from metals with reasonable work functions. Naphthalene diimides described herein have a desirable lowest unoccupied molecular orbital (LUMO) energy level of about 3.5 eV to about 4.6 eV with reference to the vacuum energy level. As known in the art, LUMO energy level and reduction potential approximately describe the same characteristics of a material. LUMO energy level values are measured with reference to the vacuum energy level, and reduction potential values are measured in solution versus a standard electrode. An advantage for device applications is that the LUMO in the crystalline solid, which is the conduction band of the organic semiconductor, and the electron affinity of the solid both are measured with reference to the vacuum level. The latter parameters are usually different from the former parameters, which are obtained from solution. Furthermore, it is desirable that the energy of the LUMO level of the naphthalene diimide is not substantially affected by the presence of polymer additive in the layer.

As indicated above, the present invention is directed to the use of an organic semiconducting composition consisting essentially of a polymer additive and an N,N'-dicycloalkylsubstituted naphthalene diimide compound having a substituted or unsubstituted cycloalkyl ring attached directly to each imide nitrogen atom, wherein any optional substituents on each of the alicyclic rings comprises at least one electron donating organic group. The two alicyclic ring systems can differ, and each alicyclic ring system can independently have different substitution or no substitution. In most embodiments, the two alicyclic ring systems are the same, although the substitution on each ring system, if any, may differ. If both alicyclic ring systems are substituted, then both alicyclic ring systems comprise at least one electron donating substituent.

When referring to electron donating groups, this can be indicated or estimated by the Hammett substituent constant ($\sigma_p$, $\sigma_m$), as described by L. P. Hammett in *Physical Organic Chemistry* (McGraw-Hill Book Co., NY, 1940), or by the Taft polar substituent constants ($\sigma_i$) as defined by R. W. Taft in *Steric Effects in Organic Chemistry* (Wiley and Sons, NY, 1956), and in other standard organic textbooks. This parameter that characterizes the ability of ring-substituents (in the para position) to affect the electronic nature of a reaction site, were originally quantified by their effect on the pKa of benzoic acid. Subsequent work has extended and refined the original concept and data, but for the purposes of prediction and correlation, standard sets of $\sigma_p$ are widely available in the chemical literature, as for example in C. Hansch et al., *J. Med. Chem.*, 17, 1207 (1973). Typically, an electron donating group has a $\sigma_p$ or $\sigma_m$ of less than zero, or less than −0.05, or even less than −0.1. The $\sigma_p$ value can be used to indicate the electron donating nature of the group in a structure according to the present invention, as in Structure (II) below even when the group is not para substituted in Structure (II).

The organic semiconducting layer composition of this invention offers several other advantages. For example, since the N,N'-cycloalkyl substituted naphthalene diimide compounds are soluble they may be deposited in a liquid form, for example from solution. With the inclusion of the polymer additive, it has now been found that the formulation may be coated onto a large area in a highly uniform manner. In the prior art, spin and drop-casting of a pure semiconducting layer may in some cases result in relatively high mobility but it is difficult to provide a large area film with a constant mobility over the entire substrate that is a specific requirement for electronic devices. Furthermore, when a polymer additive is used in the invention composition, it is possible to control the properties of the composition to adjust to printing processes, for example viscosity, solid content, and surface tension. While not wishing to be bound by any particular theory, it is also anticipated that the presence of a polymer additive in the composition fills in volume between crystalline grains otherwise being void, making the organic semiconducting layer less sensitive to air and moisture. For example, layers formed according to the present invention show very good stability in OFET devices in air.

The present invention provides an organic semiconducting layer composition (or formulation) that comprises a polymeric additive that has a permittivity, ∈, at 1,000 Hz of 5 or less and one or more N,N'-dicycloalkyl-substituted naphthalene diimide compounds. Particularly useful diimide compounds can be represented by the following general Structure (I):

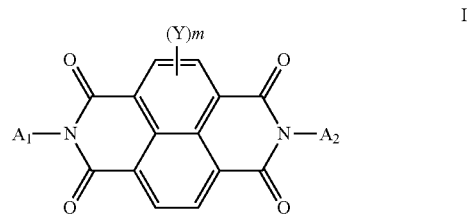

wherein $A_1$ and $A_2$ are independently substituted or unsubstituted alicyclic ring systems each comprising 4 to 10 carbons in the ring such as unbridged monocyclic or bridged bicyclic ring systems. $A_1$ and $A_2$ can be the same or different but are usually the same ring systems. Examples of alicyclic ring systems include but are not limited to, cyclobutyl, cyclopentyl, cyclohexyl, or cycloheptyl, as well as bridged alicyclic hydrocarbon systems such as bicyclo[4.4.0]decane.

In the above Structure (I), first and second dicarboxylic imide moieties are attached on opposite sides of the naphthalene nucleus at the 1,4 and 5,8 positions of the naphthalene nucleus. The naphthalene nucleus can be optionally substituted with 1 to 4 independently selected Y groups and thus m is an integer of from 0 to 4. In general, Y groups are independently selected from electron donating or electron withdrawing groups that do not affect the n-type semiconductor properties of the thin film made from the compositions of this invention.

Some examples of useful N,N'-bicycloalkyl-substituted naphthalene dimides having substituted or unsubstituted aliphatic carbocyclic (alicyclic) ring systems attached to each imide nitrogen atom are shown by the formulae I-1 through I-15 below:

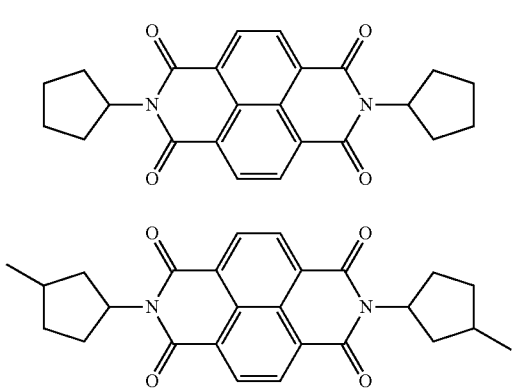

-continued
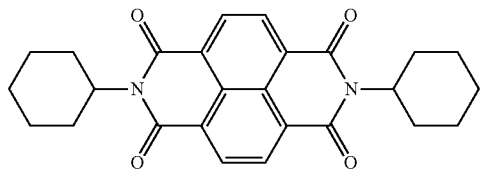
I-3
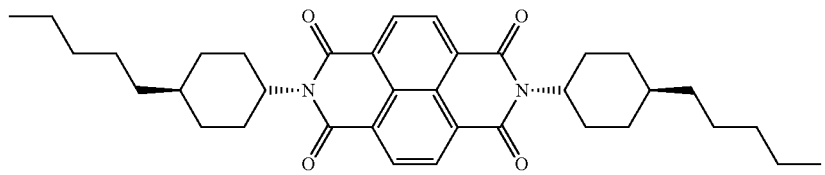
I-4
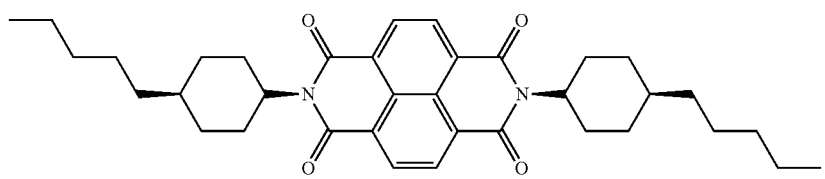
I-5
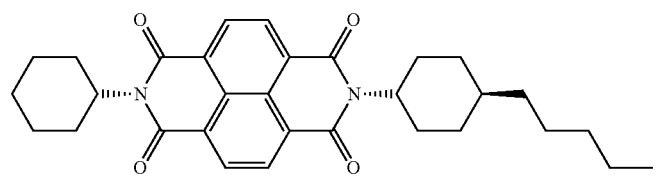
I-6
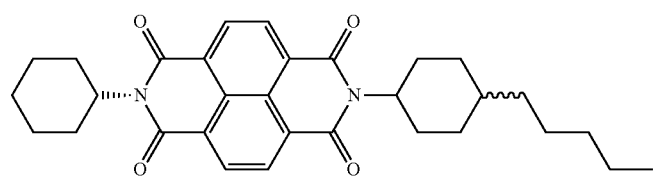
I-7
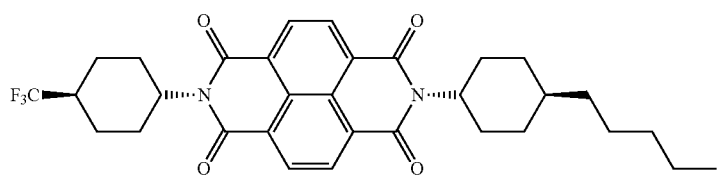
I-8
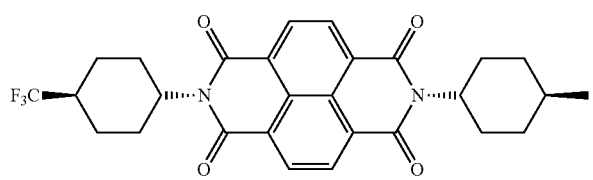
I-9
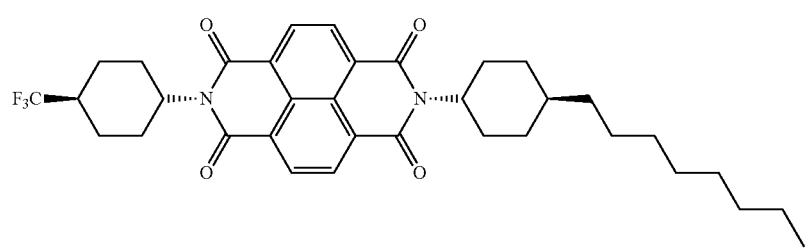
I-10

-continued

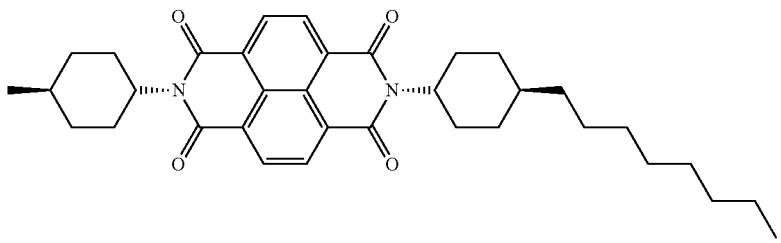

I-11

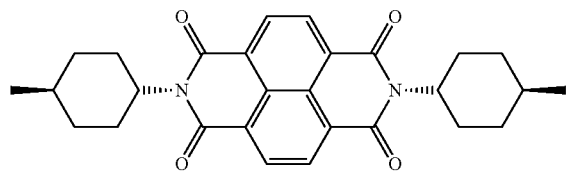

I-12

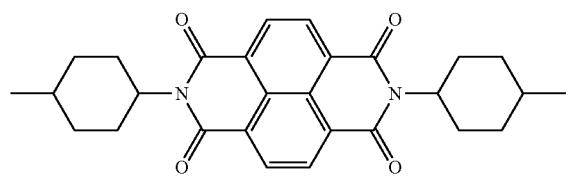

I-13

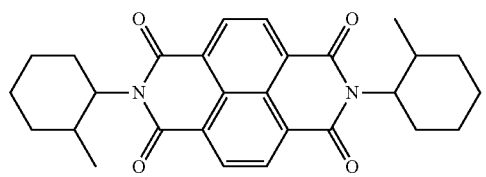

I-14

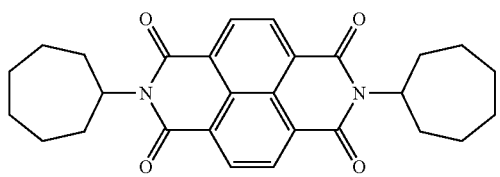

I-15

In other useful embodiments of the present invention, the organic semiconducting layer composition comprises an polymeric additive that has a permittivity, ∈, at 1,000 Hz of 5 or less and one or more N,N'-dicycloalkyl-substituted naphthalene diimide compounds that are represented by the following Structure (II):

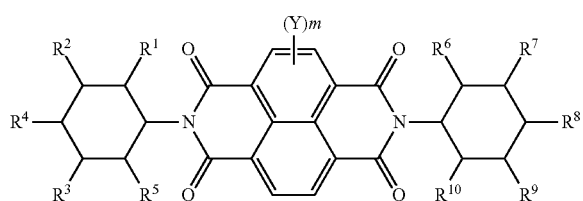

II wherein $R^1$, $R^2$, $R^3$, $R^4$, and $R^5$ (on the first cyclohexyl ring in the above structure) and $R^6$, $R^7$, $R^8$, $R^9$, and $R^{10}$ (on the second cyclohexyl ring system) are each independently H or an electron donating organic group, or any two adjacent R groups on a ring system can combine to form a four to seven (for example four to six) membered substituted or unsubstituted alicyclic ring, in which case a bridged alicyclic system is formed. If one or both alicylic ring systems in the compound is substituted, at least one substituent on, respectively, the one or both alicyclic ring systems is an electron donating group such as a $C_1$-$C_8$ organic substituent including alkyl groups. Useful organic substituents include but are not limited to, $CH_3$, linear or branched $C_2$-$C_4$ alkyl, $C_1$-$C_8$ alkylene (a monovalent unsaturated aliphatic hydrocarbon), or $C_1$-$C_8$ alkoxy groups. In the case that the first and second ring system in the compound represented by Structure II is a monocyclic ring system, for example, cyclohexyl, then all of $R^1$, $R^3$, $R^4$, $R^5$, $R^6$, $R^8$, $R^9$, and $R^{10}$ are either hydrogen or the same or different electron donating substituents. In most embodiments, all of the R groups are the same, that is, hydrogen or the same electron donating substituent.

In some other embodiments, at least two of $R^1$, $R^2$, $R^3$, $R^4$ and $R^5$ are H and any substituents on the same ring are electron donating groups such as methyl or other alkyl groups, and at least two of $R^6$, $R^7$, $R^8$, $R^9$, and $R^{10}$ are H and any substituents on the same ring are electron donating groups such as methyl or other alkyl groups. In other embodiments, at least three of $R^1$, $R^2$, $R^3$, $R^4$ and $R^5$ are H and any substituents on the same ring are electron donating groups such as methyl or other alkyl groups, and at least three of $R^6$, $R^7$, $R^8$, $R^9$, and $R^{10}$ are H and any substituents on the same ring are electron donating groups such as methyl or other alkyl groups. Still other useful diimide compounds are those in which either all of $R^1$, $R^3$, $R^4$, $R^5$, $R^6$, $R^8$, $R^9$, and $R^{10}$ are H and both $R^2$ and $R^7$ is an electron donating group such as methyl or other alkyl groups, or in which all of $R^1$, $R^2$, $R^3$, $R^4$, $R^5$, $R^6$, $R^7$, $R^8$, $R^9$, and $R^{10}$ are H.

Useful embodiments of this invention include the presence in the organic semiconducting layer composition in an organic field effect transistor, the one or more N,N'-cycloalkyl naphthalene diimide compounds being represented by either Structure (IIIa) or (IIIb):

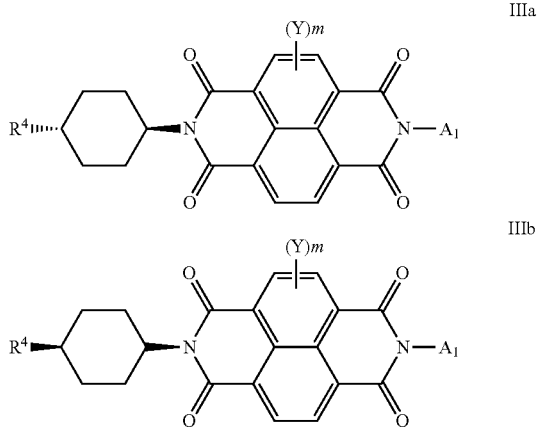

In Structures (IIIa) and (IIIb), a boldly (triangularly) solid bond line attached to the cyclohexyl ring represents a bond coming towards the viewer while a dotted bond line represents a bond going away from the viewer, such that the two boldly solid lines in Structure (IIIb) represents a cis configuration and one boldly solid line in Structure (IIIa) represents a trans configuration.

In both Structures III(a) and III(b), $R^4$ is any suitable inorganic or organic substituent, $A_1$ is a substituted or unsubstituted alicyclic ring system comprising 4 to 10 carbons in the ring as described above for Structure (I). In particular, $A_1$ can be a substituted or unsubstituted cyclohexyl ring, which if having two or more substituents can be cis, trans, or a cis-trans mixture (if $A_1$ does not have a second substituent, then cis and trans isomerism nomenclature does not readily apply), it being understood that the normal bond line to the $A_1$ ring system includes the possibility of essentially trans configuration, essentially cis configuration, an otherwise mixture of the two between molecules, a mixture within the same molecule (if more than two substituents), or the absence of cis-trans configuration on the $A_1$ ring altogether (if not more than one substituent, not including hydrogen). Two substituents on $A_1$ can form a fused aryl or cycloalkyl ring that in turn can be substituted or unsubstituted.

In other embodiments of the present invention, in Structures (IIIa) and (IIIb), $R^4$ is any suitable fluorine containing inorganic or organic substituent, and $A_1$ is a substituted or unsubstituted alicyclic ring system comprising 4 to 10 carbons in the ring as described above for Structure (I). For example, $A_1$ is a substituted or unsubstituted cyclohexyl ring, which if having two or more substituents can be cis, trans, or a cis-trans mixture (if $A_1$ does not have a second substituent, then cis and trans isomerism nomenclature does not readily apply), it being understood that the normal bond line to the $A_1$ ring system includes the possibility of essentially trans configuration, essentially cis configuration, an otherwise mixture of the two between molecules, a mixture within the same molecule (if more than two substituents), or the absence of cis-trans configuration on the $A_1$ ring altogether (if not more than one substituent, not including hydrogen). Two substituents on A1 can form a fused aryl or cycloalkyl ring that in turn can be substituted or unsubstituted.

In the general case of cyclohexyl rings displaying two or more substituents, various conformational mixtures may result, depending on the chemical nature of those substituents. In the more specific case of 1,4-disubstituted cyclohexyl groups, the substituents may be stereochemically disposed either on the same side of the ring, the cis configuration, or on opposite sides of the cyclohexyl ring, the trans configuration. In this latter case (the trans configuration) due to the above considerations, the two trans-substituents can adopt either an axial-axial or an equatorial-equatorial conformation, with this latter conformation predominating in virtually all known instances of such a case. In the former case (the cis configuration), due to the above considerations, the two cis-substituents can only adopt an axial-equatorial configuration, however, in which one of differing substituents can be either in the axial or equatorial position. More particularly, a substituent that is on the C-4 position relative to a larger ring system such as in a naphthalene tetracarboxylic diimide ring system, the conformation in which the larger ring system is equatorial and the C-4 substituent is axial tends to predominate The configuration as well as the conformations of substituted cyclohexyl derivatives can be analyzed using a variety of spectroscopic techniques, e.g., see L. M. Jackman's *Applications of Nuclear Magnetic Resonance Spectroscopy in Organic Chemistry*, 2$^{nd}$ Edition, Pergamon Press (1969) p. 238. In practice the preparation of very pure cis or trans-1,4-substituted cyclohexyl groups can be difficult, and often mixtures, to some extent, of cis and trans substituted compounds are prepared. In the present case, mixtures that are more than 70 mole percent, typically more than 80 mole percent trans will be considered essentially pure trans. Similarly, for the cis configuration, the term "essentially pure" will refer to the same mole percents, as determined by Nuclear Magnetic Resonance Spectroscopy (NMR).

In still other embodiments of the present invention, the organic semiconducting layer composition in an organic field effect transistor comprises one or more N,N'-cycloalkyl naphthalene diimide compounds as represented by Structures (IVa) and (IVb):

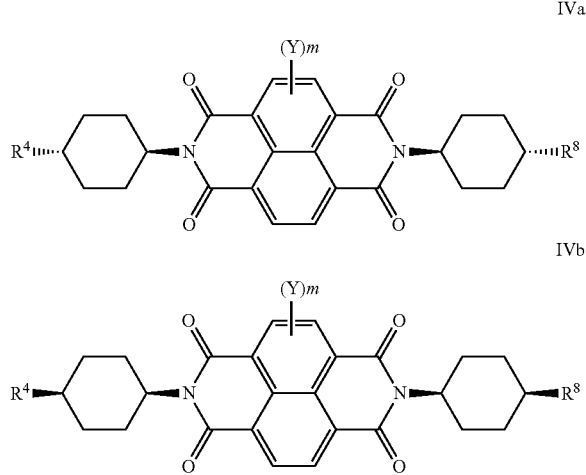

wherein $R^4$ (on the primary cyclohexyl ring) is any suitable organic substituent as described above and $R^8$ (on the secondary cyclohexyl ring system) is independently H or any substituent. In this particular embodiment, the cyclohexyl ring in Structures (IVa) and (IVb) other than the 4-substituted cyclohexyl ring is either not substituted or, like the 4-substituted cyclohexyl ring, has a sole substituent other than the attachment at the imine nitrogen, that is, both of the primary and secondary cyclohexyl ring systems in the compound comprise a single substituent other than the attachment at the imine nitrogen. Thus, both alicyclic rings are configurationally controlled in Structures (IVa) and (IVb). Useful substituents include organic groups such as $C_1$-$C_{12}$ alkyl groups (typically $C_1$-$C_8$ alkyl groups), linear or branched $C_2$-$C_8$ alkylene groups, substituted phenyl or cyclohexyl groups, $C_1$-$C_8$ alkoxy groups, $C_1$-$C_8$ carbonyl, carboxy substituents, inorganic groups such as fluorine and fluoroalkyl groups. Also envisioned are $R^8$ groups that are themselves an N,N'-cycloalkyl-substituted naphthalene-1,4,5,8-bis-carboximide moiety in which one of the imide nitrogen groups in the $R^8$ group is the point of attachment to the cyclohexyl group either directly or indirectly, for example bis compounds based on a central moiety that is disubstituted with two N,N'-cycloalkyl-substituted naphthalene-1,4,5,8-bis-carboximide moieties.

Examples of naphthalene diimide compounds useful in the present invention include but are not limited to, N,N'-(trans-4-methyl-cyclohexyl, cyclohexyl)-naphthalene-1,4,5,8 tetracarboxylic acid diimide, N,N'-(trans-4-methyl-cyclohexyl, cyclohexyl)-naphthalene-1,4,5,8 tetracarboxylic acid diimide, or N,N'-(cis-4-methyl-cyclohexyl, cyclohexyl)-naphthalene-1,4,5,8 tetracarboxylic acid diimide, N,N'-(trans-4-pentyl-cyclohexyl, cyclohexyl)-naphthalene-1,4,5,8 tetracarboxylic acid diimide, N,N'-bis(trans-4-pentyl-cyclohexyl)-naphthalene-1,4,5,8 tetracarboxylic acid diimide, N,N'-bis(cis-4-pentyl-cyclohexyl)-naphthalene-1,4,5,8 tetracarboxylic acid diimide, N,N'-(trans-4-pentyl-cyclohexyl, cis-4-pentyl cyclohexyl)-naphthalene-1,4,5,8 tetracarboxylic acid diimide N,N'-(trans-4-butyl-cyclohexyl, cyclohexyl)-naphthalene-1,4,5,8 tetracarboxylic acid diimide, N,N'-bis(trans-4-ethyl-cyclohexyl)-naphthalene-1,4,5,8 tetracarboxylic acid diimide, N,N'-bis(trans-4-octyl-cyclohexyl)-naphthalene-1,4,5,8 tetracarboxylic acid diimide, N,N'-bis(trans-4-hexyl-cyclohexyl)-naphthalene-1,4,5,8 tetracarboxylic acid diimide, N,N'-bis(trans-4-phenyl-cyclohexyl)-naphthalene-1,4,5,8 tetracarboxylic acid diimide, and N,N'-bis(trans-4-tolyl-cyclohexyl)-naphthalene-1,4,5,8 tetracarboxylic acid diimide.

In other embodiments, $R^4$ (on the primary cyclohexyl ring) can be any suitable substituent as defined above and $R^8$ (on the secondary cyclohexyl ring system) can be independently H or any fluorine containing substituent. For example, the cyclohexyl ring in Structures (IVa) and (IVb) other than the 4-substituted cyclohexyl ring is either not substituted or, like the 4-substituted cyclohexyl ring, has a sole fluorine containing substituent other than the attachment at the imine nitrogen. That is, both of the primary and secondary cyclohexyl ring systems in the compound comprise a single substituent other than the attachment at the imine nitrogen. Thus, both alicyclic rings are configurationally controlled in Structures (IVa) and (IVb).

Substituent $R^4$ or $R^8$ or any optional additional substituents on the secondary alicyclic ring can, for example, be selected from fluorine containing organic or inorganic groups. Suitable groups include but are not limited to, fluoroalkyl, fluorocycloalkyl, fluoroalkenyl, fluoroalkoxy, fluorinated aryl, and fluoralkyl substituted aryl groups, fluorine-containing groups such as $CF_3$, carbonyl-containing or carboxy-containing groups, or any other groups that do not significantly adversely affect the n-type semiconductor properties of the film made from such compounds. Examples of such organic groups include but are not limited to, partially or completely fluorinated $C_1$-$C_8$ organic substituents such as $CF_3$, linear or branched $C_2$-$C_8$ fluoroalkyl groups, $C_1$-$C_8$ fluorinated alkylene groups (a monovalent unsaturated aliphatic hydrocarbon), fluoro-substituted phenyl or hexyl groups, and $C_1$-$C_8$ alkoxy groups, $C_1$-$C_8$ carbonyl and carboxy groups. Also envisioned are $R^8$ groups that are themselves an N,N'-cycloalkyl-substituted naphthalene-1,4,5,8-bis-carboximide moiety in which one of the imide nitrogen groups in the $R^8$ group is the point of attachment to the cyclohexyl group either directly or indirectly, for example bis compounds based on a central moiety that is disubstituted with two N,N'-cycloalkyl-substituted naphthalene-1,4,5,8-bis-carboximide moieties.

Examples of such naphthalene diimide compounds useful in the present invention include but are not limited to, N,N'-bis(trans-4-trifluoromethyl-cyclohexyl)-naphthalene-1,4,5,8 tetracarboxylic acid diimide, N-(trans-4-methyl-cyclohexyl), N'-(trans-4-trifluoromethyl-cyclohexyl)-naphthalene-1,4,5,8 tetracarboxylic acid diimide, N-cyclohexyl-N'-(trans-4-trifluoromethyl-cyclohexyl)-naphthalene-1,4,5,8 tetracarboxylic acid diimide, N,N'-bis(trans-4-perfluorobutyl-cyclohexyl)-naphthalene-1,4,5,8 tetracarboxylic acid diimide, and N,N'-bis(cis-4-trifluoromethyl-cyclohexyl)-naphthalene-1,4,5,8-tetracarboxylic acid diimide.

In all of the Structures described above, the Y groups are independently selected from any suitable groups that will not adversely affect the n-type semiconductor properties of the film made from the composition of this invention. For example, the Y groups on the naphthalene nucleus can be for example, alkyl, alkenyl, alkoxy, aryl, or arylalkyl groups, halogens (such as fluorine or chlorine), cyano, fluorine-containing groups such as $CF_3$, carbonyl-containing or carboxy-containing groups. It is advantageous to avoid substituents that tend to interfere with close approach of the conjugated cores of the naphthalene diimide compounds in a stacked arrangement of the molecules that is conducive to semiconducting properties. Such substituents to be avoided include highly branched groups, ring structures and groups having more than 12 atoms, particularly where such groups or rings would be oriented to pose a significant steric barrier to the close approach of the conjugated cores. In addition, substituent groups should be avoided that substantially lower the solubility or volatility of the compounds such that the desirable fabrication processes are prevented.

In all of the structures noted above, m is an integer of 0 to 4 or typically 0, 1, or 2.

Symmetrical N,N'-cycloalkyl-substituted naphthalene diimide compounds used in this invention can be conveniently prepared by cyclizing naphthalene tetracarboxylic acid dianhydride with excess of suitable amines such as cyclohexylamine. Typical procedures are described in U.S. Pat. Nos. 4,578,334 (Borsenberger et al.), 4,719,163, (Regan et al.), and 7,422,777 (Shukla et al.) and EP 251,071 (Staudenmeyer et al.). Typical procedures for preparing unsymmetrical naphthalene tetracarboxylic acid diimides are described in U.S. Pat. No. 4,714,666 (Troester et al.). The crude materials can then be purified by train sublimation at $10^{-5}$ to $10^{-6}$ torr.

Configurationally controlled N,N'-dicycloalkyl-substituted naphthalene-1,4,5,8-bis(dicarboximide) compounds used in this invention can be conveniently prepared, for example, by reacting, at an elevated temperature for a sufficient period of time, a mixture of commercially available 1,4,5,8-naphthalenetetracarboxylic acid anhydride and a configurationally controlled (cis or trans) 4-substituted cyclohexylamine in a suitable solvent. A skilled artisan can thereby obtain the desired compounds by using conventional techniques involving separation and purification. The resulting material can be proved to be homogenous and characterized by the desired structural configuration by standard chromatographic and spectral determinations.

Similarly, compounds having different alicyclic rings can be prepared by reacting a mixture of known 1,8-N-cyclohexylcarboximido-4,5-naphthalenedicarboxylic acid anhydride with a configurationally controlled 4-substituted cyclohexylamine in solvent. The resulting slurry can be filtered, washed, air dried, and recrystallized as appropriate to provide the desired product as a solid material that is consistent with its assigned structure.

The specific preparations described below for the Examples are included for reference for the preparation of various naphthalene diimide compounds useful in the invention. These methods are not meant to be limiting, however, since such compounds can prepared by other methods or by minor variants of the included procedures, including well-established methods in the art.

The substituted naphthalene diimide compound, or mixture thereon, is present in the organic semiconducting composition or layer of this invention in an amount of at least 50 weight % and typically of at least 75 weight %, and up to and including 95 weight %, based on total composition solids or dry layer weight. A skilled artisan would be able to find the optimal amount of naphthalene diimide compound and the optimal amount of polymer additive described below to achieve the desired organic semiconducting layer properties.

Useful polymer additives according to the present invention are materials of low permittivity, that is, those having a permittivity, $\in$ at 1,000 Hz of 5.0 or less. The polymer additive can have a permittivity at 1,000 Hz of 4 or less, or typically 3 or less. For example, the polymer additive can have a permittivity at 1,000 Hz of at least 1.5. It is especially desired that the permittivity of the polymer additive is in the range from 2 to 4. While not wishing to be bound by any particular theory it is believed that the use of polymers with a permittivity of greater than 5 at 1,000 Hz may lead to a reduction in the naphthalene diimide layer mobility in an electronic device, for example an OFET. In addition, high permittivity polymers could also result in increased current hysteresis of the device, which is undesirable. The polymer additive may comprise one or more insulating polymers or semiconducting polymers.

Polymer additives used in the present invention have lower permittivity and have few permanent dipoles that could otherwise lead to random fluctuations in molecular site energies. The permittivity (dielectric constant) can be determined by the ASTM D150 test method. It is also desired that polymer additive have solubility parameters with low polar and hydrogen bonding contributions as materials of this type have low permanent dipoles.

In some embodiments, the polymer additive has at least 95% or typically at least 98% of the atoms being hydrogen, fluorine, and carbon atoms. The polymer additive can contain conjugated bonds, especially conjugated double bonds or aromatic rings. The polymer additive should be capable of forming a film, for example a flexible film.

Suitable polymer additives include but are not limited to, styrenic polymers, polyalkylenes, poly(meth)acrylates, polyalkenes, substituted and unsubstituted polynaphthalenes, polycycloalkyls, and other classes of condensation and vinyl polymers that have the properties noted above. Specific useful polymer additives are listed in the following table:

| Polymer Additive | Low frequency (1000 Hz) Permittivity |
|---|---|
| Polystyrene | 2.5 |
| Poly(α-methylstyrene) | 2.6 |
| Poly(α-vinyl naphthalene) | 2.6 |
| Poly(vinyl toluene) | 2.6 |
| Polyethylene | 2.2-2.3 |
| cis-Polybutadiene | 2.0 |
| Polypropylene | 2.2 |
| Polyisoprene | 2.3 |
| Poly(4-methyl-1-pentene) | 2.1 |
| Poly(4-methylstyrene) | 2.7 |
| Poly(chorotrifluoroethylene) | 2.3-2.8 |
| Poly(2-methyl-1,3-butadiene) | 2.4 |
| Poly(p-xylylene) | 2.6 |
| Poly(α-α-α'-α' tetrafluoro-p-xylylene) | 2.4 |
| Poly[1,1-(2-methyl propane)bis(4-phenyl)carbonate] | 2.3 |
| Poly(cyclohexyl methacrylate) | 2.5 |
| Poly(chlorostyrene) | 2.6 |
| Poly(2,6-dimethyl-1,4-phenylene ether) | 2.6 |
| Polyisobutylene | 2.2 |
| Poly(vinyl cyclohexane) | 2.2 |
| Poly(vinyl cinnamate) | 2.9 |
| Poly(4-vinyl biphenyl) | 2.7 |
| Poly(methyl methacrylate) | 3.1-3.5 |

The amount of one or more polymer additives in the organic semiconducting layer or composition is at least 1 and up to and including 50 weight % and typically at least 5 weight % and up to and including 25 weight %, based on total composition solids or layer dry weight.

In some embodiments of the present invention, an organic semiconducting layer composition is used to prepare an organic field effect transistor and consists essentially of a compound defined by any of Structures (I), (II), (IIIa), or (IIIb), and specifically one or more of Compounds I-1 through I-15, and a polymer additive wherein the polymer additive is one or more of polystyrene, poly(α-methylstyrene), Topas™ 8007 cyclic olefin copolymer, poly(4-methylstyrene), and poly(styrene-co-α-methylstyrene). The compositions can be formulated in one or more suitable solvents such as one or more of toluene, anisole, 1,2,4,-trimethylbenzene, p-xylene, and N,N'-dimethylaniline.

In some other embodiments of the present invention an organic semiconducting layer composition is used to prepare an organic field effect transistor and consisting essentially of one or more compounds of Structure (IVa) or (IVb) described above, and one or more polymer additives wherein the polymer additive is one or more of poly(α-methylstyrene), poly(methyl methacrylate), poly(vinyl cinnamate), and poly(4-vinylbiphenyl). The composition can be formulated in one or more solvents including 1,2,4-trimethylbenzene.

Electronic Devices

Figure 1B:
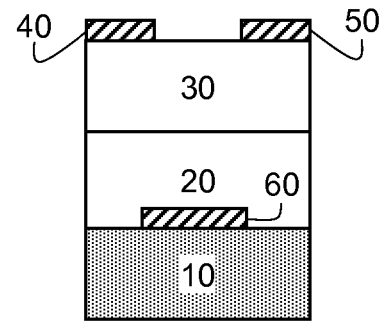
Figure 1C:
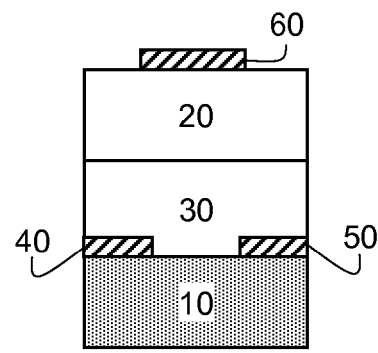
Figure 1D:
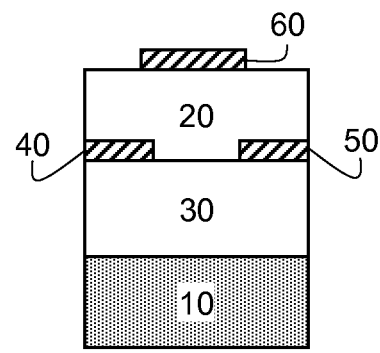

Four possible cross-sectional views of typical organic field effect transistors are shown in FIGS. 1a through 1d wherein FIGS. 1a and 1b illustrate a typical bottom contact configuration and FIGS. 1c and 1d illustrate a typical top gate configuration.

Each field effect transistor (FET) in the embodiments of FIGS. 1a-1d contains source electrode 40, drain electrode 50, gate electrode 60, gate dielectric 20, substrate 10, and semiconductor organic layer 30 in the form of a film connecting source electrode 40 to drain electrode 50, which organic semiconductor layer comprises a compound selected from the class of N,N'-cycloalkyl-substituted naphthalene-diimide compounds and a polymer additive as described herein.

When the TFT operates in an accumulation mode, the charges injected from source electrode 40 into the organic semiconductor layer 30 are mobile and a current flows from source 40 to drain 50, mainly in a thin channel region within about 100 Angstroms of the semiconductor-dielectric interface. See A. Dodabalapur, L. Torsi H. E. Katz, *Science* 1995, 268, 270, hereby incorporated by reference. In the configuration of FIG. 1a, the charge need only be injected laterally from source electrode 40 to form the channel. In the configuration of FIG. 1b, the charge is injected vertically for source electrode 40 into organic semiconductor layer 30 to form the channel. In the absence of a gate field, the channel ideally has few charge carriers and as a result there is ideally no source-drain conduction.

The off current is defined as the current flowing between source electrode 40 and drain electrode 50 when charge has not been intentionally injected into the channel by the application of a gate voltage. For an accumulation-mode TFT, this occurs for a gate-source voltage more negative, assuming an n-channel, than a certain voltage known as the threshold voltage. See Sze in *Semiconductor Devices—Physics and Technology*, John Wiley & Sons (1981), pages 438-443. The on current is defined as the current flowing between source electrode 40 and drain electrode 50 when charge carriers have been accumulated intentionally in the channel by application of an appropriate voltage to gate electrode 60, and the channel is conducting. For an n-channel accumulation-mode TFT, this occurs at gate-source voltage more positive than the threshold voltage. It is desirable for this threshold voltage to be zero or slightly positive for n-channel operation. Switching between on and off is accomplished by the application and removal of an electric field from gate electrode 60 across gate dielectric 20 to the semiconductor-dielectric interface, effectively charging a capacitor.

In accordance with the present invention, the organic semiconductor composition described herein, when used in the form of an n-channel layer, can exhibit high performance under inert conditions as well as in air without the need for special chemical underlayers.

A process for preparing an organic semiconducting layer comprises:

A) depositing on a substrate a liquid layer of a composition of this invention that consists essentially of a N,N'-cycloalkyl substituted naphthalene diimide compound as previously described herein, and a polymer additive (or precursor thereof), and optionally a solvent, and B) from the liquid layer forming a solid layer that is an organic semiconducting layer.

The electronic devices of this invention comprise the organic semiconducting layer described above. The electronic device may include, without limitation, an organic field effect transistor (OFET), organic light emitting diode (OLED), photodetector, sensor, logic circuit, memory element, capacitor or photovoltaic (PV) cell. For example, the active semiconductor channel between the drain and source in an OFET may comprise the organic semiconducting layer. As another example, an electron injection or transport layer in an OLED device—may comprise the organic semiconducting layer. The organic semiconducting compositions of this invention and layers formed there from have particular utility in OFET's.

The invention can be used in a process for the production of semiconductor components and electronic devices incorporating such components. In one embodiment, a substrate is provided and a layer of the organic semiconducting composition of this invention can be applied to the substrate, electrical contacts being made with the layer. The exact process sequence is determined by the structure of the desired semiconductor component. Thus, in the production of an organic field effect transistor, for example, a gate electrode can be first deposited on a flexible substrate, for example an organic polymer film, the gate electrode can then be insulated with a dielectric and then source and drain electrodes and a layer of the n-channel semiconductor layer can be applied on top. The structure of such a transistor and hence the sequence of its production can be varied in the customary manner known to a person skilled in the art. Thus, alternatively, a gate electrode can be deposited first, followed by a gate dielectric, then the organic semiconductor layer can be applied, and finally the contacts for the source electrode and drain electrode deposited on the organic semiconducting layer. A third structure could have the source and drain electrodes deposited first, then the organic semiconducting layer, with dielectric and gate electrode deposited on top.

The skilled artisan will recognize other structures can be constructed or intermediate surface modifying layers can be interposed between the above-described components of the thin film transistor. In most embodiments, a field effect transistor comprises an insulating layer, a gate electrode, a organic semiconducting layer comprising an organic semiconducting diimide and a polymer additive as described herein, a source electrode, and a drain electrode, wherein the insulating layer, the gate electrode, the organic semiconducting layer, the source electrode, and the drain electrode are in any sequence as long as the gate electrode, and the organic semiconducting layer both contact the insulating layer, and the source electrode and the drain electrode both contact the organic semiconducting layer.

Support

A support can be used for supporting the OFET during manufacturing, testing, or use. The skilled artisan will appreciate that a support selected for commercial embodiments may be different from one selected for testing or screening various embodiments. In other embodiments, a support may be detachably adhered or mechanically affixed to a substrate, such as when the support is desired for a temporary purpose. For example, a flexible polymeric support may be adhered to a rigid glass support, which support could be removed. In some embodiments, the support does not provide any necessary electrical function for the FET. This type of support is considered a "non-participating support".

Useful support materials can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible support is used in some embodiments to allow for roll processing, which may be continuous, providing economy of scale and economy of manufacturing over flat or rigid supports. The flexible support chosen is capable of be wrapped around the circumference of a cylinder of less than about 50 cm diameter, typically less than 25 cm diameter, or even less than 10 cm diameter, without distorting or breaking, using low force such as by unaided hands. The flexible support may be rolled upon itself.

In some embodiments of the invention, the support is optional. For example, in a top construction as in FIG. 1b, when the gate electrode or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, for example, manufacturing, transport, testing, or storage. For example, a flexible polymeric support may be adhered to a rigid glass support, which flexible support could be removed.

Gate Electrode

The gate electrode can be any useful conductive material. A variety of gate materials known in the art, are also suitable including metals, degenerately doped semiconductors, conducting polymers, and printable materials such as carbon ink or silver-epoxy. For example, the gate electrode may comprise doped silicon, or a metal, such as aluminum, chromium, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide a support function. For example, doped silicon can function as the gate electrode and support the OFET.

Gate Dielectric

The gate dielectric is provided on the gate electrode to electrically insulate the gate electrode from the balance of the OFET device. The gate dielectric can be provided in the OFET as a separate layer, or formed on the gate such as by oxidizing the gate material to form the gate dielectric. The dielectric layer may comprise two or more layers having different dielectric constants.

The gate dielectric should have a suitable dielectric constant that can vary widely depending on the particular device and circumstance of use. For example, a dielectric constant from about 2 to about 100 or even higher is known for a gate dielectric. The gate dielectric layer should have a resistivity of $10^{14}$ ohm-cm or greater in OFET applications. The gate dielectric may comprise organic polymeric materials, inorganic materials, and organic-inorganic composite materials. Useful polymer materials for the gate dielectric may comprise one or more dielectric polymers such as acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a $C_1$ to $C_{18}$ straight or branched chain alkyl group; phenol-aldehyde (co)polymers and (co)oligomers and combinations thereof. The gate dielectric may comprise a polymeric material, such as polyvinylidenedifluoride (PVDF), cyanocelluloses, polyimides, and others known in the art. The gate electric may comprise a plurality of layers of different materials having different dielectric constants.

In certain embodiments, polymer gate dielectric may possess one or more of the following characteristics: coatable out of solution, crosslinkable, photo-patternable, high thermal stability (for example, stable up to a temperature of about 250° C.), low processing temperatures (for example, less than about 150° C. or less than 100° C.), and are compatible with flexible substrates. Crosslinkable or photo-patternable polymers are particularly desirable. This is because they provide flexibility in manufacturing methods, would easily integrate with solution processed device layers, and could allow for high-speed roll-to-roll processing. Polymers are photo-patternable if they include one or more crosslinking (that is, crosslinkable) groups that can be induced to form a crosslinked network upon exposure to radiation (most commonly, UV radiation). The exposed (crosslinked portion of the polymer) becomes insoluble in certain solvents and the unexposed portion of the polymer can be washed away using a developing solvent. This is an example of a negative-acting photo-patternable polymer. It is also possible to photo-pattern a polymer that is initially insoluble in certain solvents and that becomes soluble in UV-exposed areas upon exposure. This is an example of a positive-acting photo-patternable polymer.

For OFETs, the polymeric dielectric layer generally has a thickness of less than about 5000 Angstroms (Å), typically less than about 3000 Å, or less than about 2000 Å. The polymeric dielectric layer generally has a thickness of at least about 500 Å or typically at least about 1000 Å. The thickness can be determined through known methods such as ellipsometry and profilometry. For embedded capacitors and printed circuit board applications, the thickness can include those described above for OFETs, but can also be at least 10 µm or at least 20 µm.

The term dielectric polymers herein encompasses homopolymers, copolymers derived from polymerization of two or more monomers, post-derivatized (co)polymers including graft (co)polymers, and low molecular weight homopolymers or copolymers. The polymers may be linear, branched, hyperbranched, or dendritic.

Useful materials for the gate dielectric may comprise, for example, an inorganic electrically insulating material. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these materials can be used for the gate dielectric. In addition, polymeric materials such as polyimides and insulators that exhibit a high dielectric constant are also suitable dielectric materials as described in U.S. Pat. No. 5,981,970 (Dimitrakopoulous et al.) that is hereby incorporated by reference.

Useful dielectric polymers include acrylic, styrenic, and styrenic-acrylic latexes comprising alkyl (meth)acrylate, styrene, and alkyl-substituted styrene wherein the alkyl group is a $C_1$ to $C_{18}$ straight or branched chain alkyl group. Useful optional monomers used to derive these latex-based polymers include (meth)acrylic acid, hydroxyethyl (meth)acrylate, and glycidyl (meth)acrylate. Such latexes are selected from the group: Latexes A, defined herein as one or more latex resins comprising at least 85 weight % or at least 90 weight % of alkyl (meth)acrylate, styrene, and alkyl-substituted styrene. Useful additional monomers used to derive these latex resins include (meth)acrylic acid (up to 5 weight %), hydroxyethyl (meth)acrylate (up to 10 weight %), and glycidyl (meth)acrylate (up to 5 weight %). Such latexes generally have an average particle size of less than about 150 nm or less than about 100 nm.

Particularly useful dielectric polymers with high resistivity (above $10^{14}$ ohm-cm) are Acrylic Latexes B and Styrene-Acrylic Latexes C and combinations thereof. Acrylic Latexes B are defined herein as one or more acrylic latexes comprising at least 85 weight % or at least 90 weight % of methyl methacrylate or butyl acrylate or both. Styrene-Acrylic Latexes C are defined herein as one or more styrene-acrylic latexes comprising at least 85 weight % or at least 90 weight % of methyl methacrylate, butyl acrylate, or styrene, or mixtures thereof. Useful additional monomers used to derive Acrylic Latexes B and Styrene-Acrylic Latexes C include (meth)acrylic acid (up to 5 weight %), hydroxyethyl methacrylate (up to 10 weight %), and glycidyl methacrylate (up to 5 weight %). Commercial examples of acrylic and styrenic acrylic latexes useful as dielectric polymers include Joncryl® 95 and 1915 (co)polymers (Johnson Polymer). Methods for synthesizing suitable latex polymers have been reported in WO 03/099574 (Caspar et al.).

Further useful dielectric polymers include solution-based acrylic, styrenic and styrenic-acrylic polymers. Herein the term "solution-based" refers to materials that are soluble in solvents such as water or one or more common organic solvents including alcohols, ethers, esters, ketones, and aromatic hydrocarbons. Such solution-based acrylic, styrenic and styrenic-acrylic polymers have a Mw of less than 100,000 and an acid number less than about 250.

In yet another embodiment of the present invention, useful dielectric polymers include heteroatom-substituted styrenic polymers selected from the group consisting of: partially hydrogenated poly(4-hydroxy)styrene, poly(4-hydroxy)styrene (PHS), and copolymers of PHS with hydroxyethyl (meth)acrylate, alkyl (meth)acrylate, styrene, and alkyl-substituted styrene wherein the alkyl group is a $C_1$ to $C_{18}$ straight or branched chain alkyl group. When PHS homopolymer is used, the branched structure is desired and the (co)polymers have a Mw of less than about 30,000. Partially hydrogenated PHS refers to PHS polymers that have been hydrogenated up to about 50 equivalent % of the unsaturation within the polymer. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with butyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other useful dielectric polymers include phenol-aldehyde (co)polymers/(co)oligomers and combinations thereof that are derived from mono- and bis-phenols and mono- and bis-aldehydes selected from the group consisting of: phenol, alkyl- and aryl-substituted phenols; formaldehyde, and alkyl-, aryl- and heteroatom-substituted aldehydes. The phenol-aldehyde resins can be further derivatized, for example, the hydroxy group converted to an ether group. Such (co) polymers/(co)oligomers have a Mw of 20,000 or less or 10,000 or less. Commercial examples include Novolac®/Novolak® resins (Schenectady International Inc., Schenectady N.Y.).

Other useful dielectric polymers include poly(vinyl acetate) homopolymers having a Mw of 100,000 or less.

The above polymers may be plasticized for improved flexibility, adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethylene glycol) dibenzoate, and phthalate-based plasticizers such as dibutyl phthalate. A number of potentially suitable plasticizers for various polymers and details regarding their use may be found in the following reference: "Handbook of Plasticizers," Ed. G. Wypych, ChemTec Publishing, Toronto, Ont. 2004.

Source and Drain Electrodes

The source electrode and drain electrode are separated from the gate electrode by the gate dielectric while the organic semiconductor layer can be over or under the source electrode and drain electrode. The source and drain electrodes can be any useful conductive material including but not limited to, those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof.

The thin film electrodes (for example, gate electrode, source electrode, and drain electrode) can be provided by any useful means such as physical vapor deposition (for example, thermal evaporation, sputtering) or ink jet printing. The patterning of these electrodes can be accomplished by known methods such as shadow masking, additive photolithography, subtractive photolithography, printing, microcontact printing, and pattern coating.

The organic semiconducting layer can be provided over or under the source and drain electrodes, as described above in reference to the thin film transistor article. The present invention also provides an integrated circuit comprising a plurality of OFETs made by the process described herein. The n-channel organic semiconducting layer consisting essentially of the above-described N,N'-cycloalkyl naphthalene-diimide compounds and a polymer additive are capable of being formed on any suitable substrate which can comprise the support and any intermediate layers such as a dielectric or insulator material, including those known in the art.

Processing

Organic semiconducting layers used in the invention can be readily processed and are thermally and chemically stable to such an extent that they can be dissolved in hot or cold organic solvents. The organic semiconductor layer or the layer(s) of the gate dielectric may be deposited by spin coating. The entire process of making the thin film transistors or integrated circuits of the present invention can be carried out below a maximum support temperature of generally at or below 450° C. or typically at or below 250° C., or even at or below 150° C. The temperature selection generally depends on the support and processing parameters known in the art, once a skilled artisan has the knowledge of the present invention contained herein. These temperatures are well below traditional integrated circuit and semiconductor processing temperatures, which enables the use of any of a variety of relatively inexpensive supports, such as flexible polymeric supports. Thus, the present invention enables production of relatively inexpensive integrated circuits containing organic thin film transistors with significantly improved performance.

In cases where the gate dielectric is a polymer, both the organic semiconducting layer and the gate dielectric layer can be deposited from solution, making the coating of large areas less difficult.

An FET structure of FIG. 1a can be prepared by spin coating the organic semiconducting layer onto the dielectric layer with pre-patterned source and drain electrodes. In another embodiment, an FET structure of FIG. 1c can be prepared by spin coating the organic semiconducting layer onto the substrate with pre-patterned source and drain electrodes. Next, a dielectric layer in the form of a polymer is spin coated onto the organic semiconducting layer followed by the deposition of the gate electrode by vacuum deposition or liquid deposition of a conductive metal or metal dispersion, respectively.

Devices in which the n-channel organic semiconducting layers described herein are useful include thin film transistors (TFTs), especially OFETs. Such layers can be used also in various types of devices having organic p-n junctions, such as described on pages 13 to 15 of U.S. Patent Application Publication 2004/0021204 (Liu) that is hereby incorporated by reference.

Electronic devices in which FET's and other devices are useful include, for example, more complex circuits such as shift registers, integrated circuits, logic circuits, smart cards, memory devices, radio-frequency identification tags, backplanes for active matrix displays, active-matrix displays (for example liquid crystal or OLED), solar cells, ring oscillators, and complementary circuits, such as inverter circuits, for example, in combination with other transistors made using available p-type organic semiconductor materials such as pentacene. In an active matrix display, a thin film transistor of the present invention can be used as part of voltage hold circuitry of a pixel of the display. In devices containing FET's, the FET's are operatively connected by means known in the art.

Electronic devices of this invention can be integrated circuits, active-matrix displays, and solar cells comprising a multiplicity of thin-film transistors. In some embodiments, the multiplicity of the thin-film transistors is on a non-participating support that is optionally flexible.

For example, some devices or articles of this invention include a polymer additive that has a permittivity at 1000 Hz of from 2 to 4, at least 95 weight % of its atoms are hydrogen, fluorine, and carbon atoms, and is a styrenic polymer, polyalkylene, poly(meth)acrylate, polyalkene, polynaphthalene, polycycloalkyl, or combinations thereof, and the polymer additive is present in an amount of at least 5 and up to and including 25 weight %, based on total layer weight, and the naphthalene diimide is represented by any of the following Structures (IIIa), (IIIb), (IVa), and (IVb):

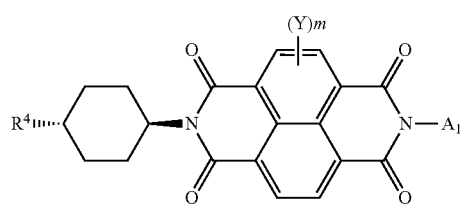
IIIa

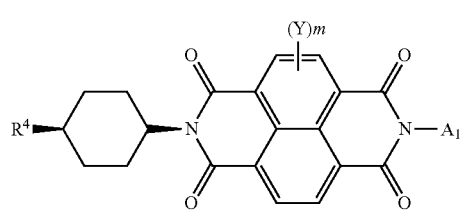
IIIb

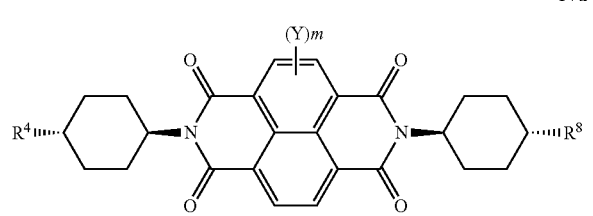
IVa

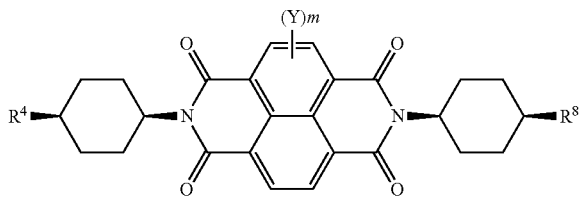
IVb wherein $R^4$ is a $C_1$-$C_{12}$ alkyl group, $C_2$-$C_8$ alkylene group, substituted phenyl or cyclohexyl group, $C_1$-$C_8$ alkoxy group, $C_1$-$C_8$ carbonyl, carboxy substituent, carbonyl-containing substituent, fluorine, or fluorine containing organic or inorganic group, $R^8$ is H, any of the substituents defined for $R^4$, or an N,N'-cycloalkyl-substituted naphthalene-1,4,5,8-bis-carboximide moiety in which one of the imide nitrogen groups in the $R^8$ group is the point of attachment to the cyclohexyl group either directly or indirectly to provide a bis compounds based on a central moiety that is disubstituted with two N,N'-cycloalkyl-substituted naphthalene-1,4,5,8-bis-carboximide moieties, the Y groups are independently alkyl, alkenyl, alkoxy, aryl, or arylalkyl groups, halogens (such as fluorine or chlorine), cyano, fluorine-containing groups, carbonyl-containing or carboxy-containing groups, and m is an integer of from 0 to 2, and the naphthalene diimide is present in an amount of at least 75 and up to and including 95 weight %, based on the total layer weight.

The present invention provides at least the following embodiments and combinations thereof:

1. An organic semiconducting composition consisting essentially of an N,N-dicycloalkyl-substituted naphthalene diimide and a polymer additive comprising an insulating or semiconducting polymer having a permittivity at 1000 Hz of at least 1.5 and up to and including 5.

2. The composition of embodiment 1 wherein the polymer additive has a permittivity at 1000 Hz of from 2 to 4.

3. The composition of embodiment 1 or 2 wherein at least 95 weight % of its atoms are hydrogen, fluorine, and carbon atoms.

4. The composition of any of embodiments 1 to 3 wherein the polymer additive is present in an amount of at least 1 and up to and including 50 weight %, based on total composition solids.

5. The composition of any of embodiments 1 to 4 wherein the polymer additive is a styrenic polymer, polyalkylene, poly(meth)acrylate, polyalkene, polynaphthalene, polycycloalkyl, or combinations thereof.

6. The composition of any of embodiments 1 to 5 wherein the polymer additive comprises one or more of the following polymers having the listed low frequency (1000 Hz) permittivity:

| | |
|---|---|
| Polystyrene | 2.5 |
| Poly(α-methylstyrene) | 2.6 |
| Poly(α-vinyl naphthalene) | 2.6 |
| Poly(vinyl toluene) | 2.6 |
| Polyethylene | 2.2-2.3 |
| cis-Polybutadiene | 2.0 |
| Polypropylene | 2.2 |
| Polyisoprene | 2.3 |
| Poly(4-methyl-1-pentene) | 2.1 |
| Poly(4-methylstyrene) | 2.7 |
| Poly(chorotrifluoroethylene) | 2.3-2.8 |

-continued

| | |
|---|---|
| Poly(2-methyl-1,3-butadiene) | 2.4 |
| Poly(p-xylylene) | 2.6 |
| Poly(α-α-α'-α' tetrafluoro-p-xylylene) | 2.4 |
| Poly[1,1-(2-methyl propane)bis(4-phenyl)carbonate] | 2.3 |
| Poly(cyclohexyl methacrylate) | 2.5 |
| Poly(chlorostyrene) | 2.6 |
| Poly(2,6-dimethyl-1,4-phenylene ether) | 2.6 |
| Polyisobutylene | 2.2 |
| Poly(vinyl cyclohexane) | 2.2 |
| Poly(vinyl cinnamate) | 2.9 |
| Poly(4-vinyl biphenyl) | 2.7 |
| Poly(methyl methacrylate) | 3.1-3.5 |

7. The composition of any of embodiments 1 to 6 wherein the naphthalene diimide have a lowest unoccupied molecular orbital energy level of from about 3.5 eV to about 4.6 eV with reference to the vacuum energy level.

8. The composition of any of embodiments 1 to 7 wherein the naphthalene diimide is represented by the following Structure (I):

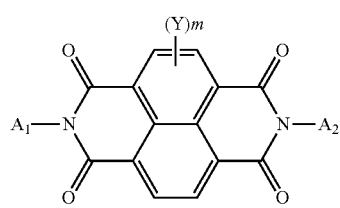

wherein $A_1$ and $A_2$ are independently alicyclic rings having 4 to 10 carbon atoms in the ring, the Y groups are independently electron donating or electron withdrawing groups, and m is an integer of 0 to 4.

9. The composition of any of embodiments 1 to 8 wherein the naphthalene diimide is represented by the following Structure (II):

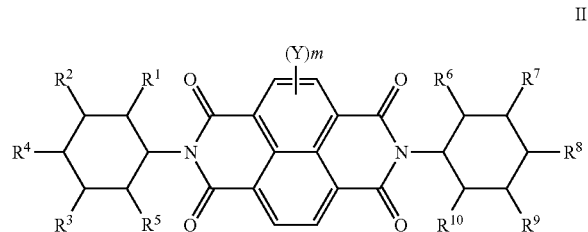

wherein $R^1, R^2, R^3, R^4, R^5, R^6, R^7, R^8, R^9$, and $R^{10}$ are each independently H or an electron donating organic group, or any two adjacent R groups on a ring system can combine to form a four- to seven-membered substituted or unsubstituted alicyclic ring, the Y groups are independently alkyl, alkenyl, alkoxy, aryl, or arylalkyl groups, halogens, cyano, fluorine-containing groups such as $CF_3$, carbonyl-containing or carboxy-containing groups, m is an integer of from 0 to 4.

10. The composition of any of embodiments 1 to 9 wherein the naphthalene diimide is present in an amount of at least 50 and up to and including 95 weight %, based on the total composition solids.

11. An article comprising a support having disposed thereon a dry organic semiconducting layer obtained from the composition of any of embodiments 1 to 10.

12. A thin-film, field-effect transistor comprising a dielectric layer, a gate electrode, a source electrode, a thin film of an organic semiconducting composition, and a drain electrode, wherein the dielectric layer, the gate electrode, the thin film of organic semiconductor material, source electrode, and the drain electrode are in any sequence as long as the gate electrode and thin film of the organic semiconducting composition both contact the dielectric layer, and the source electrode and the drain electrode both contact the thin film of the organic semiconducting composition, wherein the thin film of organic semiconductor is obtained from the composition of any of embodiments 1 to 10.

13. The transistor of embodiment 12 wherein the thin film of the organic semiconducting composition is capable of exhibiting a field electron mobility greater than 0.001 $cm^2$/V·sec.

14. The transistor of embodiment 12 or 13 that has an on/off ratio of a source/drain current of at least $10^4$.

15. The transistor of any of embodiments 12 to 14 wherein the gate electrode is adapted for controlling, by means of a voltage applied to the gate electrode, a current between the source and drain electrodes through the thin film of organic semiconductor material.

16. The transistor of any of embodiments 12 to 15 wherein the source, drain, and gate electrodes each independently comprise a material selected from doped silicon, metal, and a conducting polymer.

17. An electronic device selected from the group consisting of integrated circuits, active-matrix display, and solar cells comprising a multiplicity of thin-film transistors according to any of embodiments 12 to 16.

18. The electronic device of embodiment 17 wherein the multiplicity of the thin-film transistors is on a non-participating support that is optionally flexible.

The present invention is demonstrated by the following examples that are intended to be exemplary and not limiting in any manner.

A. Material Synthesis

The N,N'-dicycloalkyl-substituted naphthalene dimide compounds used in this invention are conveniently prepared by cyclizing naphthalene tetracarboxylic acid dianhydride with excess cycloalkyl amine following a general method described in Rademacher, A. et al. *Chem. Ber.* 1982 115, 2927. For example, N,N'-dicyclohexyl-1,4,5,8-naphthalene tetracarboxylic acid diimide was conveniently prepared by cyclizing naphthalene tetracarboxylic acid dianhydride with excess cyclohexylamine. Accordingly, a mixture of naphthalene tetracarboxylic acid dianhydride (Aldrich Chemical Company), 3-4 equivalents excess of an amine, for example cyclohexylamine (Aldrich Chemical Co.), zinc acetate in catalytic amounts, and 10-15 ml of quinoline per gram of dianhydride molecule was heated over 4-5 hours at a temperature of about 220° C. The mixture was allowed to cool to room temperature, and the precipitated solids were collected, filtered, and washed with acetone, followed by washing by 200 ml each of boiling 0.1 M aqueous $Na_2CO_3$, boiling water, and warm toluene, that was kept below the temperature at which the product would be substantially dissolved. The solid was then purified by train sublimation at $10^{-5}$ to $10^{-6}$ torr.

As described above, other diimide compounds were conveniently prepared by cyclizing naphthalene tetracarboxylic acid dianhydride with excess of the suitable amine. The crude materials were then purified by train sublimation at $10^{-5}$ to $10^{-6}$ torr.

Preparation of N,N'-(trans-4-pentylcyclohexyl)-1,4,5,8-Naphthodiimide (Compound I-4)

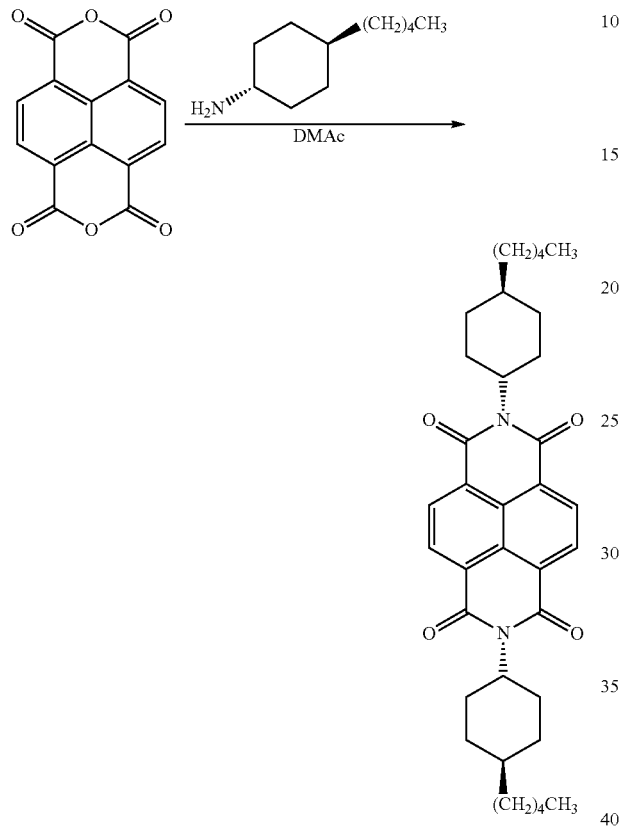

A mixture of 4-pentylcyclohexanone (25.0 g, 148.8 mmol), hydroxylamine hydrochloride (15.4 g), sodium acetate (18.2 g) in ethanol-water (60-100 ml) was refluxed for 3.5 hours then poured into an ice cold water. The resulting mixture was extracted with diethyl ether to obtain a pale yellow oil which distilled under reduced to obtain the desired oxime that was reduced to the corresponding amine as follows.

A solution of oxime (22.8 g) in anhydrous ethanol (350 ml) was brought to reflux and then pieces of sodium metal (44 g) were slowly added. The mixture was refluxed for additional 1 hour and then cooled to room temperature and stirred overnight. Reaction mixture was poured into dilute HCl (170 ml conc. HCl in 170 ml of water; pH~1) with cooling to obtain a precipitate that was filtered and dried. The solid was stirred in aqueous solution (pH~14) and extracted with ether to obtain the desired trans-4-pentylcyclohexylamine as an oil (17.5 g).

A mixture of 1,4,5,8-naphthalenetetracarboxylic dianhydride (1.34 g, 5.00 mmol) and trans-4-pentylcyclohexylamine (3.26 g) in 20 ml of DMAc were combined then sealed in a pressure vessel, and next stirred at ambient temperature for 10 minutes. The mixture was heated at 140° C. for 4 hours and then cooled. The resulting slurry was diluted with methanol and the solid filtered. The solid was washed with methanol and air dried to provide a pale beige solid (2.19 g, 95.6%), mp 361-363° C. This material proved to be substantially chromatographically homogenous and displayed spectral characteristic consistent with its assigned structure. A sample of this material was sublimed at $10^{-3}$-$10^{-4}$ torr between 200-250° C.

Preparation of N,N'-(4-methylcyclohexyl)-1,4,5,8-Naphthodiimide (Compound I-13)

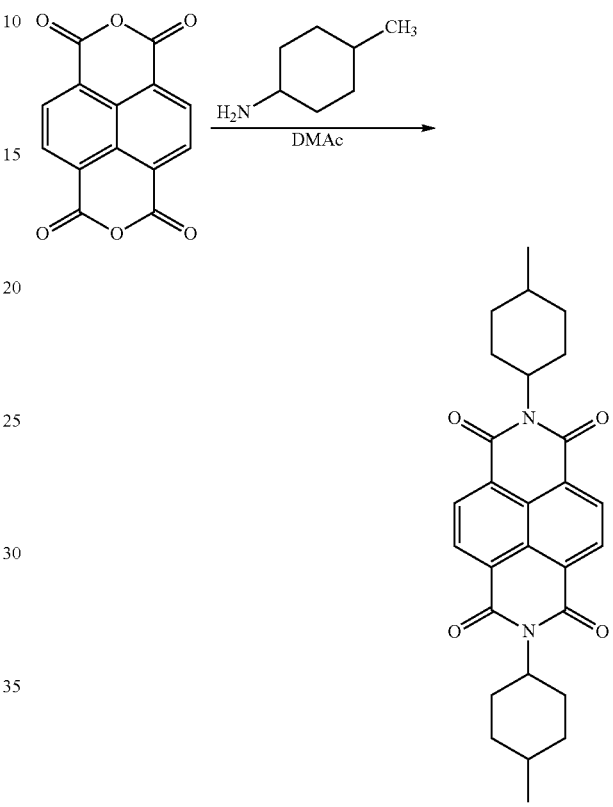

A mixture of 1,4,5,8-naphthalenetetracarboxylic dianhydride (1.34 g, 5.00 mmol) and 4-methylcyclohexylamine (2.26 g, 20.0 mmol) in 20 ml of dimethylacetamide (DMAc) were combined then sealed in a pressure vessel, and next stirred at ambient temperature for 10 minutes. The mixture was heated at 140° C. for 4 hours and then cooled. The resulting slurry was diluted with methanol and the solid was filtered. The solid was washed with methanol and air dried to provide a pale beige solid (2.19 g; 95.6%), mp 361-363° C. This material proved to be substantially chromatographically homogenous and displayed spectral characteristic consistent with its assigned structure. A sample of this material was sublimed at $10^{-3}$-$10^{-4}$ torr between 180-200° C.

Preparation of N-(cyclohexyl)-N'-(trans-4-pentylcyclohexyl)-1,4,5,8-Naphthodiimide (Compound I-6)

N-Cyclohexyl-5,6-Acenaphthenedicarboxylic Acid Imide

A slurry of 5,6-acenaphthenedicarboxylic acid anhydride (33.6 g, 0.150 mol) (B. M. Trost, G. Michael Bright, Charles Frihart, and David Brittelli, *Journal of the American Chemical Society*, 93(3), 737-45 (1971); James J. Jordan, Jr; U.S. Pat. No. 3,935,226) in 175 ml of DMAc was treated with cyclohexylamine (34.2 ml, 0.300 mol) over one minute and a thick paste formed. This mixture was heated at 155-160° C. for 2 hours. The resulting deep green solution was poured into 2 liters of water. The mixture was stirred for 10 minutes and then was filtered. The accumulated solid was washed with water and air-dried to provide a yellow solid (45.1 g, 98.5%), mp 264-265° C. A portion (2.00 g) of this material was recrystallized from a mixture of n-propyl acetate and heptanes (200 ml, 1:1 v/v) to provide fine yellow needles (1.42 g, 70%), mp 266-267° C. Anal. Calcd for $C_{20}H_{19}NO_2$: C, 78.66; H, 6.27; N, 4.59. Found C, 78.39; H, 6.15; N, 4.83.

N-Cyclohexyl-1,4,5,8-naphthalenetetracarboxylic Acid Anhydride Imide

A well-stirred solution of 350 ml of acetic acid and 35 ml of water was warmed to 95-100° C. (internal) and 8 ml of concentrated sulfuric acid was treated with sodium dichromate dihydrate (82.0 g, 0.275 mol), with the addition the mixture's temperature fell. When the internal temperature was warmed to 95-100° C., N-cyclohexyl-5,6-acenaphthenedicarboxylic acid imide (15.25 g, 50.0 mmol) was added at once. A vigorous reaction began with a thick precipitate forming and reaction reflux initiating. The mixture was stirred at reflux for 15 hours, after which, the now nearly homogenous mixture, was cooled briefly. The warm mixture was poured into 2 liters of ice/water and stirred for 20 minutes. The cold mixture was filtered and the isolated solid was washed with water until the filtrate appeared colorless. The solid was air dried to provide a bright yellow solid (13.12 g, 75%), mp 316-317° C. This solid was recrystallized from 0.5 liter of toluene to afford a bright yellow solid (8.90 g, 51.0%), 316-317° C. Anal. Calcd for $C_{20}H_{15}NO_5$: C, 68.76; H, 4.33; N, 4.01. Found C, 68.91; H, 4.51; N, 4.11.

A mixture of N-cyclohexyl-1,4,5,8-naphthalenetetracarboxylic acid anhydride imide (1.75 g, 5.00 mmol) and trans-4-pentylcyclohexylamine (1.13 g; 10.0 mmol) and 20 ml of DMAc were combined then sealed in a pressure vessel, and next stirred at ambient temperature for 10 minutes. The mixture was heated at 135-140° C. for 1 hour and then cooled. The resulting mixture was diluted with methanol and the solid was filtered. The solid was washed with methanol and air dried to provide a peach solid (2.20 g, 96.1%), mp 343-344° C. This solid was recrystallized from 80 ml of DMAc to provide a pale yellow solid (1.90 g, 91.3%), mp 344-346° C. A sample of this material was sublimed at between $10^{-3}$-$10^{-4}$ torr and 200-220° C.; mp 347-349° C.

B. Device Preparation

In order to test the electrical characteristics of the various materials of this invention, field-effect transistors were typically made using the top-contact geometry. The substrate used was a heavily doped silicon wafer that also served as the gate of the transistor. The gate dielectric was a thermally grown $SiO_2$ layer with a thickness of 185 nm. In cases where a polymeric dielectric was used, an appropriate polymer was spin coated onto the wafer.

Preparation of Polymer Dielectric Layer

A solution of poly(methyl methacrylate) (PMMA, 7 weight %, Aldrich Chemical, 120,000 Mw) in anisole was filtered through a Whatman 0.45 μm glass microfiber filter into a clean glass vial or container. A filtered solution of PMMA was spin coated onto a doped silicon wafer at 2000-4000 rpm. The PMMA-coated wafer was placed on a hot plate and gradually heated from 50 to 120° C. over a period of 15 minutes. Finally, the temperature was increased to 150° C. and was held for 30 minutes. Each sample was gradually cooled to room temperature over a period of 30 minutes. The thickness of each coated PMMA layer coated was in the range of 200 to 280 nm.

General Procedure for the Preparation of Organic Semiconducting Layer Without Polymeric Additive (Comparatives)

A solution of NDI (0.5 weight %) in distilled 1,2,4-trimethylbenzene was spin coated onto a dielectric layer at 800 RPM (30 sec) and 5000 RPM (45 sec). Each sample was heated at 100° C. for 1 to 24 hours.

General Procedure for the Preparation of Organic Semiconducting Layer With Polymeric Additive (Invention)

A solution of NDI (0.5 weight %) in distilled 1,2,4-trimethylbenzene containing a polymer additive (0.01 to 1 weight %) [for example, polystyrene from Aldrich Chemical Co., average Mw 4,000 to 400,000, poly(vinylidene fluoride) from Aldrich Chemical Co., average Mw 71,000 to 534,000, Zeonex® RS420™, poly (alpha-methylstyrene), and others noted below]. Each organic semiconducting formulation was coated onto a dielectric at 800 RPM for 30 seconds followed by 5000 RPM for 45 seconds. Each sample was annealed in a vacuum oven at 100° C. for 1-24 hours.

Contacts Deposition

Gold contacts of a thickness of 50 nm were deposited through a shadow mask. The channel width was held at 650 μm while the channel lengths were varied between 50 and 150 μm. Some experiments were performed to look at the effect of other contact materials. A few devices were made with a bottom-contact geometry in which the contacts were deposited on dielectric layer prior to the coating of an organic semiconducting layer.

C. Device Measurement and Analysis

Electrical characterization of the fabricated devices was performed with a Hewlett Packard HP 4145B® parameter analyzer. The probe measurement station was held in a positive argon environment for all measurements with the exception of those purposely testing the stability of the devices in air. The measurements were performed under sulfur lighting unless sensitivity to white light was being investigated. The devices were exposed to air prior to testing.

For each experiment performed, between 4 and 12 individual devices were tested using each prepared organic semiconducting layer, and the results were averaged. For each device, the drain current (Id) was measured as a function of source-drain voltage (Vd) for various values of gate voltage (Vg). For most devices, Vd was swept from 0 V to 80 V for each of the gate voltages measured, typically 0 V, 20 V, 40 V, 60 V, and 80 V. In these measurements, the gate current (Ig) was also recorded in order to detect any leakage current through the device. Furthermore, for each device the drain current was measured as a function of gate voltage for various values of source-drain voltage. For most devices, Vg was swept from 0 V to 80 V for each of the drain voltages measured, typically 40 V, 60 V, and 80 V.

Parameters extracted from the data include field-effect mobility (μ), threshold voltage (Vth), subthreshold slope (S), and the ratio of $I_{on}/I_{off}$ for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

wherein W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit. Mobilities can also be extracted from the linear region, where Vd≦Vg–Vth. Here the drain current is given by the equation (see Sze, noted above):

$$I_d = \frac{W}{L} \mu C_{ox} \left[ V_d(V_g - V_{th}) - \frac{V_d^2}{2} \right]$$

For these experiments, mobilities in the linear regime were not extracted, since this parameter is very much affected by any injection problems at the contacts. In general, non-linearities in the curves of $I_d$ versus $V_d$ at low $V_d$ indicate that the performance of the device is limited by injection of charge by the contacts. In order to obtain results that are largely independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (that is, the device is turning on).

D. Results

The following examples demonstrate that organic semiconducting layers comprising inventive compositions consisting essentially of N,N'-dicycloalkyl-substituted naphthalene diimide compounds and specific polymeric additives exhibited high mobilities and on/off ratios. The mobilities calculated in the saturation region were between 0.07 and 1 cm²/V·sec, with on/off ratios of $10^4$ to $10^5$. In addition to the stable performance, the devices also showed excellent reproducibility.

Invention Example 1 and Comparative Example 1

This example demonstrates the effect of using an organic semiconducting layer formulation, comprising N,N'-trans-4-pentylcyclohexyl)-1,4,5,8-naphthodiimide (Compound I-4) and polystyrene as a polymer additive in accordance with the present invention, on the performance of n-type OFET device on a silicon dioxide dielectric in a top source-drain contact configuration as depicted in FIG. 1b.

Test Device-1

Comparative Example 1

A heavily doped silicon wafer with a thermally-grown SiO₂ dielectric layer with a thickness of 195 nm was used as the substrate. The wafer was cleaned for 10 minutes in a piranha cleaning solution (known in the art), followed by a 6-minute exposure in a UV/ozone chamber. A solution of N,N'-trans-4-pentylcyclohexyl)-1,4,5,8-naphthodiimide (Compound I-4) (0.5 weight %) in distilled 1,2,4-trimethylbenzene was spin coated onto a SiO₂ dielectric layer at 800 RPM (30 seconds) and 5000 RPM (45 seconds). A sample was heated in air at 100° C. for 1-24 hours. Subsequently, a gold source and drain electrodes were vapor deposited through a shadow mask to a thickness of 50 nm. The resulting devices had a 650 μm channel width with channel lengths varying from 50 to 150 μm. Multiple OFET's were prepared and 4 to 12 representative samples were tested for each deposition run. The averaged results appear in TABLE I below.

The electrical parameters of the devices were measured in an argon or air atmosphere using a Hewlett-Packard 4145B® semiconductor parameter analyzer. For each thin film transistor, the field effect mobility, μ, was calculated from the slope of the $(I_D)^{1/2}$ versus $V_G$ plot. The average mobility was found to be 0.03 cm²/V·sec in the saturation region, the average on-off ratio was 3×10⁶, and the average threshold voltage was 70 V. Saturation mobilities of up to 0.07 cm²/V·sec were measured for these devices.

Test Device-2

Invention Example 1

A heavily doped silicon wafer with a thermally-grown SiO₂ layer with a thickness of 195 nm was used as the substrate. The wafer was cleaned for 10 minutes in a piranha cleaning solution, followed by a 6-minute exposure in a UV/ozone chamber. An organic semiconducting formulation consisting essentially of N,N'-trans-4-pentylcyclohexyl)-1,4,5,8-naphthodiimide (Compound I-4) (0.5 weight %) and polystyrene (0.5 weight %, Aldrich Chemical Co., average Mw 200,000) in distilled 1,2,4-trimethylbenzene was coated onto silicon dioxide dielectric at 800 RPM for 30 seconds followed by 5000 RPM for 45 seconds. A sample was annealed in air at 100° C. for 1 hour. Subsequently, a gold source and drain electrodes were vapor deposited through a shadow mask to a thickness of 50 nm. The resulting devices had a 650 μm channel width, with channel lengths varying from 50 to 150 μm. Multiple OFET's were prepared and 4 to 12 representative samples were tested for each deposition run. The averaged results appear in TABLE I below.

The electrical parameters of the devices were measured in an argon atmosphere using a Hewlett-Packard 4145B® semiconductor parameter analyzer. For each thin film transistor, the field effect mobility, μ, was calculated from the slope of the $(I_D)^{1/2}$ versus $V_G$ plot. The average mobility was found to be 0.12 cm²/V·sec in the saturation region, the average on-off ratio was 3×10⁶, and the average threshold voltage was 60 V. Saturation mobilities of up to 0.2 cm²/V·sec were measured for these devices.

TABLE I

| Thin Film Device | Polystyrene (weight %) | Device Performance Over Time | μ (cm²/V · sec) | $V_{th}$ (V) | $I_{on}/I_{off}$ |
|---|---|---|---|---|---|
|  | 0 | 1 hour | 0.035 | 79 | 3 × 10⁶ |
|  |  | 91 hours | 0.025 | 76 | 3 × 10⁵ |
| 2 | 50 | 1 hour | 0.2 | 60 | 3 × 10⁶ |
|  |  | 91 hours | 0.34 | 71 | 4 × 10⁶ |

The data in TABLE I clearly demonstrate that the performance of the OFET Test Device 2 prepared according to the present invention was significantly improved over the Comparative Test Device 1 that is outside the present invention. Furthermore, Invention Test Device 2 showed significantly improved stability in performance over time.

Invention Example 2 and Comparative Example 2

This example demonstrates the effect of using an organic semiconducting layer formulation consisting essentially of N,N'-trans-4-pentylcyclohexyl)-1,4,5,8-naphthodiimide (Compound I-4) and polystyrene as the polymer additive in accordance with the present invention, on the performance of an n-type OFET device containing a PMMA dielectric in top source-drain contact configuration as depicted in FIG. 1b.

Preparation of PMMA Dielectric Layer

A solution of poly(methyl methacrylate) (PMMA, 7 weight %, Aldrich Chemical Co., 120,000 mw) in anisole was filtered through a Whatman 0.45 μm glass microfiber filter into a clean glass vial or container. The filtered solution was spin coated onto a doped silicon wafer at 2000-4000 rpm. The coated wafer was then placed onto a hot plate and gradually heated from 50 to 120° C. over a period of 15 minutes. Finally, the temperature was increased to 150° C. and held for 30 minutes. Each sample was gradually cooled to room temperature over a period of 30 minutes. The thickness of coated dielectric layer was usually in the range of 200-280 nm.

Test Device 3

Comparative Example 2

A solution of N,N'-trans-4-pentylcyclohexyl)-1,4,5,8-naphthodiimide (Compound I-4) (0.5 weight %) in distilled 1,2,4-trimethylbenzene was spin coated onto the dielectric layer described above at 800 RPM (30 seconds) and 5000 RPM (45 seconds). Each sample was heated in air at 100° C. for 1-24 hours. Subsequently, a gold source and drain electrodes were vapor deposited through a shadow mask to a thickness of 50 nm. The devices had a 650 μm channel width with channel lengths varying from 50 to 150 μm. Multiple OFET's were prepared and 4 to 12 representative samples were tested for each deposition run. The averaged results appear in TABLE II below.

The electrical parameters of the devices were measured and calculated as described above for Invention Example 1. The average mobility was found to be 0.45 $cm^2/V \cdot sec$ in the saturation region, the average on-off ratio was $6 \times 10^5$, and the average threshold voltage was 61 V. Saturation mobilities of up to 0.7 $cm^2/V \cdot sec$ were measured for these devices.

Test Device 4

Invention Example 2

An organic semiconducting formulation consisting essentially of N,N'-trans-4-pentylcyclohexyl)-1,4,5,8-naphthodiimide (Compound I-4) (0.5 weight %) and polystyrene (0.5 weight %, Aldrich Chemical Co., average Mw 200,000) as the polymer additive in distilled 1,2,4-trimethylbenzene was coated onto the PMMA dielectric layer at 800 RPM for 30 seconds followed by 5000 RPM for 45 seconds. Each sample was annealed in air at 100° C. for 1 hour. Subsequently, a gold source and drain electrodes were vapor deposited through a shadow mask to a thickness of 50 nm. The resulting devices had a 650 μm channel width with channel lengths varying from 50 to 150 μm. Multiple OFET's were prepared and 4 to 12 representative samples were tested for each deposition run. The averaged results appear in TABLE II below.

The electrical parameters of the devices were measured and calculated as described for Invention Example 1. The average mobility was found to be 0.64 $cm^2/V \cdot sec$ in the saturation region, the average on-off ratio was $1 \times 10^5$, and the average threshold voltage was 58 V. Saturation mobilities of up to 0.7 $cm^2/V \cdot sec$ were measured for devices prepared in this way.

TABLE II

| Test Device | Polystyrene (weight %) | Device Performance Over Time | μ ($cm^2/V \cdot sec$) | $V_{th}$ (V) | $I_{on}/I_{off}$ |
|---|---|---|---|---|---|
|  | 0 | 1 hour | 0.55 | 61 | $6 \times 10^5$ |
|  |  | 23 hours | 0.40 | 38 | $5 \times 10^5$ |
| 4 | 50 | 1 hour | 0.64 | 60 | $1 \times 10^5$ |
|  |  | 23 hours | 0.61 | 59 | $2 \times 10^3$ |

Invention Example 2 in TABLE II clearly demonstrated that the performance of an OFET device in Test Device 4 according to the present invention was significantly improved over the Comparative Example 2 Test Device 3. Furthermore, Test Device 4 showed significantly stability in performance over time.

Invention Example 3

This example demonstrates the effect of using an organic semiconducting layer formulation according to this invention and consisting essentially of N,N'-trans-4-pentylcyclohexyl)-1,4,5,8-naphthodiimide (Compound I-4) and Zeonex® RS420 as the polymer additive and the performance of an n-type OFET device on a PMMA dielectric layer that was prepared as described for Invention Example 2 in a top source-drain contact configuration as depicted in FIG. 1b.

Test Device 5

Invention Example 3

An organic semiconducting layer formulation consisting essentially of N,N'-trans-4-pentylcyclohexyl)-1,4,5,8-naphthodiimide (Compound I-4) (0.5 weight %) and Zeonex® RS420 (0.1 weight %) in distilled 1,2,4-trimethylbenzene was coated onto the PMMA dielectric layer at 800 RPM for 30 seconds followed by 5000 RPM for 45 seconds. Each sample was annealed in air at 100° C. for 1 hour. Subsequently, a gold source and drain electrodes were vapor deposited through a shadow mask to a thickness of 50 nm. The resulting devices had a 650 μm channel width with channel lengths varying from 50 to 150 μm. Multiple OFET's were prepared and 4 to 12 representative samples were tested for each deposition run. The averaged results appear in TABLE III below along with the results previously reported for Test Device 3 (Comparative Example 2).

The electrical parameters of the devices were measured and calculated as described above for Invention Example 1. The average mobility was found to be 0.75 $cm^2/V \cdot sec$ in the saturation region, the average on-off ratio was $1 \times 10^5$, and the average threshold voltage was 48 V. Saturation mobilities of up to 0.9 $cm^2/V \cdot sec$ were measured for these devices.

TABLE III

| Test Device | Zeonex® RS420 (weight %) | Device Performance Over Time | μ ($cm^2/V \cdot sec$) | $V_{th}$ (V) | $I_{on}/I_{off}$ |
|---|---|---|---|---|---|
|  | 0 | 1 hour | 0.55 | 61 | $6 \times 10^5$ |
|  |  | 23 hours | 0.40 | 38 | $5 \times 10^5$ |

TABLE III-continued

| Test Device | Zeonex® RS420 (weight %) | Device Performance Over Time | μ (cm²/V·sec) | $V_{th}$ (V) | $I_{on}/I_{off}$ |
|---|---|---|---|---|---|
| 5 | 50 | 1 hour | 0.77 | 45 | $2 \times 10^5$ |
|   |    | 23 hours | 0.70 | 56 | $2 \times 10^4$ |

The data in TABLE III clearly demonstrate that the performance of OFET device in Invention Example 3 (Test Device 5) that was prepared according to this invention was significantly improved over Test Device 3 of Comparative Example 2. Furthermore, Test Device 5 showed significantly stability in performance over time.

Invention Example 4

This example demonstrates the effect of using organic semiconductor layer formulations consisting essentially of N,N'-(4-methylcyclohexyl)-1,4,5,8-naphthodiimide (Compound I-13) and polystyrene as the polymer additive in accordance with the present invention, on the performance of n-type OFET device on a silicon dioxide dielectric layer in a top source-drain contact configuration as depicted in FIG. 1b.

Test Device 6

Comparative Example 3

A solution of N,N'-(4-methylcyclohexyl)-1,4,5,8-naphthodiimide (Compound I-13) (1 weight %) in distilled 1,2,4-trimethylbenzene was spin coated onto the dielectric layer at 800 RPM (30 seconds) and 5000 RPM (45 seconds). Each sample was heated in air at 100° C. for 1-24 hours. Subsequently, a gold source and drain electrodes were vapor deposited through a shadow mask to a thickness of 50 nm. The resulting devices had a 650 μm channel width and channel lengths varying from 50 to 150 μm. Multiple OFET's were prepared and 4 to 12 representative samples were tested for each deposition run. The averaged results appear in TABLE IV below.

The electrical parameters of the devices were measured and calculated as described for Invention Example 1 above. The average mobility was found to be $5 \times 10^{-5}$ cm²/V·sec in the saturation region, the average on-off ratio was $4 \times 10^2$, and the average threshold voltage was 85 V.

Test Device 7

Invention Example 4

An organic semiconducting composition consisting essentially of N,N'-(4-methylcyclohexyl)-1,4,5,8-naphthodiimide (Compound I-13) (1 weight %) and polystyrene (0.5 weight %, Aldrich Chemical Co., average Mw 200,000) as the polymer additive in distilled 1,2,4-trimethylbenzene was coated onto the silicon dioxide dielectric layer at 800 RPM for 30 seconds followed by 5000 RPM for 45 seconds. Each sample was annealed in air at 100° C. for 1 hour. Subsequently, a gold source and drain electrodes were vapor deposited through a shadow mask to a thickness of 50 nm. The resulting devices had a 650 μm channel width with channel lengths varying from 50 to 150 μm. Multiple OFET's were prepared and 4 to 12 representative samples were tested for each deposition run. The averaged results appear in TABLE IV below.

The electrical parameters of the devices were measured and calculated as described in Invention Example 1. The average mobility was found to be 0.012 cm²/V·sec in the saturation region, the average on-off ratio was $1 \times 10^6$, and the average threshold voltage was 63 V.

TABLE IV

| Test Device | Polystyrene (weight %) | Device Performance Over Time | μ (cm²/V·sec) | $V_{th}$ (V) | $I_{on}/I_{off}$ |
|---|---|---|---|---|---|
|   | 0 | 1 hour | $5 \times 10^{-5}$ | 85 | $8 \times 10^2$ |
| 7 | 33 | 1 hour | 0.012 | 63 | $1 \times 10^6$ |

The data in TABLE IV clearly demonstrate that the performance of OFET device of the present invention (Test Device 7) showed significantly improved properties over the Comparative Example 3 Test Device 6.

Invention Example 5

This example demonstrates the effect of using an organic semiconductor layer formulation comprising N-(cyclohexyl)-N'-(trans-4-pentylcyclohexyl)-1,4,5,8-naphthodiimide (Compound I-6) and polystyrene as the polymer additive in accordance with the present invention, on the performance of n-type OFET device on a silicon dioxide dielectric layer in a top source-drain contact configuration as depicted in FIG. 1b.

Test Device 8

Comparative Example 4

A solution of N-(cyclohexyl)-N'-(trans-4-pentylcyclohexyl)-1,4,5,8-baphthodiimide (Compound I-6) (1 weight %) in distilled 1,2,4-trimethylbenzene was spin coated onto the dielectric layer at 800 RPM (30 seconds) and 5000 RPM (45 seconds). Each sample was heated in air at 100° C. for 1-24 hours. Subsequently, a gold source and drain electrodes were vapor deposited through a shadow mask to a thickness of 50 nm. The resulting devices had a 650 μm channel width with channel lengths varying from 50 to 150 μm. Multiple OFET's were prepared and 4 to 12 representative samples were tested for each deposition run. The averaged results appear in TABLE V below.

The electrical parameters of the devices were measured and calculated as described in Invention Example 1. The OFET devices were very poor and the nominal mobility was ~$1 \times 10^{-6}$ cm²/V·sec in the saturation region.

Test Device 9

Invention Example 5

An organic semiconducting composition consisting essentially of N-(cyclohexyl)-N'-(trans-4-pentylcyclohexyl)-1,4,5,8-naphthodiimide (Compound I-6) (1 weight %) and polystyrene (0.5 weight %, Aldrich Chemical Co., average Mw 200,000) as the polymer additive in distilled 1,2,4-trimethylbenzene was coated onto the dielectric layer at 800 RPM for 30 seconds followed by 5000 RPM for 45 seconds. Each sample was annealed in air at 100° C. for 1 hour. Subsequently, a gold source and drain electrodes were vapor deposited through a shadow mask to a thickness of 50 nm. The resulting devices had a 650 μm channel width and channel lengths varying from 50 to 150 μm. Multiple OFET's were prepared and 4 to 12 representative samples were tested for each deposition run. The averaged results appear in TABLE V below.

The electrical parameters of the devices were measured and calculated as described above in Invention Example 1. The average mobility was found to be 0.012 cm$^2$/V·sec in the saturation region, the average on-off ratio was $1\times10^5$, and the average threshold voltage was 83 V.

TABLE V

| Test Device | Polystyrene (weight %) | Device Performance Over Time | μ (cm$^2$/V · sec) | $V_{th}$ (V) | $I_{on}/I_{off}$ |
|---|---|---|---|---|---|
|  | 0 | 1 hour | $1 \times 10^{-6}$ | 95 | $8 \times 10^1$ |
| 9 | 42 | 1 hour | 0.002 | 83 | $3 \times 10^5$ |

The data in TABLE V clearly demonstrate that the performance of the OFET device of this invention (Test Device 9) exhibited significantly properties over the Comparative Example 4 Test Device 8.

Invention Example 6

This example demonstrates the effect of using an organic semiconductor layer composition comprising N,N'-(trans-4-pentylcyclohexyl)-1,4,5,8-naphthodiimide (Compound I-4) and PMMA as a higher permittivity polymer additive according to the present invention on the performance of n-type OFET device (Test Device 10) on a silicon dioxide dielectric layer in a top source-drain contact configuration as depicted in FIG. 1b An organic semiconducting composition consisting essentially of N,N'-(trans-4-pentylcyclohexyl)-1,4,5,8-naphthodiimide (Compound I-4) (0.5 weight %) and PMMA (0.5 weight %, Aldrich Chemical Co., average Mw 120,000) in distilled 1,2,4-trimethylbenzene was coated onto the dielectric layer at 800 RPM for 30 seconds followed by 5000 RPM for 45 seconds. Each sample was annealed in air at 100° C. for 1 hour. Subsequently, a gold source and drain electrodes were vapor deposited through a shadow mask to a thickness of 50 nm. The resulting devices had a 650 μm channel width and channel lengths varying from 50 to 150 μm. Multiple OFET's were prepared and 4 to 12 representative samples were tested for each deposition run. The averaged results appear in TABLE VI below.

The electrical parameters of the devices were measured and calculated as described above for Invention Example 1. The average mobility was found to be 0.35 cm$^2$/V·sec in the saturation region, the average on-off ratio was $4\times10^6$, and the average threshold voltage was 75 V. Saturation mobilities of up to 0.5 cm$^2$/V·sec were measured for these devices.

TABLE VI

| Test Device | PMMA (weight %) | Device Performance Over Time | μ (cm$^2$/V · sec) | $V_{th}$ (V) | $I_{on}/I_{off}$ |
|---|---|---|---|---|---|
| 10 | 50 | 1 hour | 0.34 | 75 | $4 \times 10^6$ |
|  |  | 23 hours | 0.12 | 73 | $5 \times 10^5$ |

The data in TABLE VI clearly demonstrate the desirable performance of the OFET device of this invention containing a high permittivity polymer additive.

The invention has been described in detail with particular reference to certain preferred embodiments thereof, but it will be understood that variations and modifications can be effected within the spirit and scope of the invention.

The invention claimed is:

1. An organic semiconducting composition consisting essentially of an N,N-dicycloalkyl-substituted naphthalene diimide and a polymer additive comprising an insulating or semiconducting polymer having a permittivity at 1000 Hz of at least 1.5 and up to and including 5, wherein the organic semiconducting composition is capable of exhibiting a field electron mobility greater than 0.001 cm$^2$/V·sec, the polymer additive has a permittivity at 1000 Hz of from 2 to 4, at least 95 weight % of its atoms are hydrogen, fluorine, and carbon atoms, and is a styrenic polymer, polyalkylene, poly(meth)acrylate, polyalkene, polynaphthalene, polycycloalkyl, or combinations thereof, and the polymer additive is present in an amount of at least 5 and up to and including 50 weight %, based on total organic conducting composition weight, and the naphthalene diimide is represented by any of the following Structures (IIIa), (IIIb), (IVa), and (IVb):

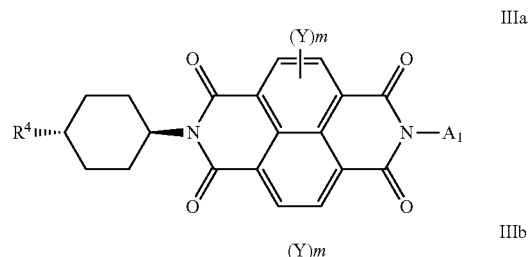

IIIa

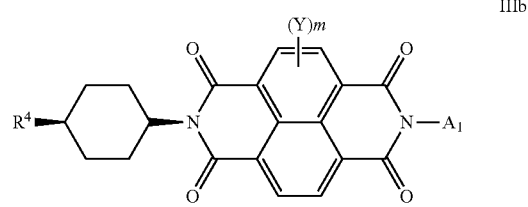

IIIb

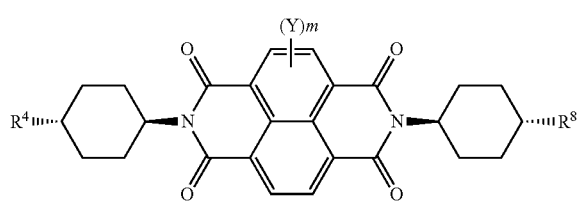

IVa

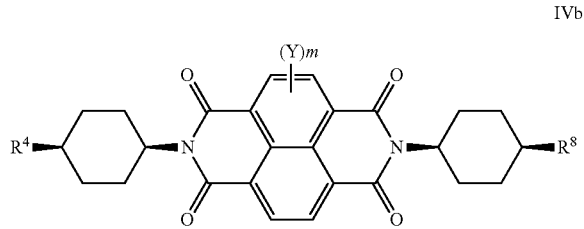

IVb wherein $R^4$ is a $C_1$-$C_{12}$ alkyl group, $C_2$-$C_8$ alkylene group, substituted phenyl or cyclohexyl group, $C_1$-$C_8$ alkoxy group, $C_1$-$C_8$ carbonyl, carboxy substituent, carbonyl-containing substituent, fluorine, or fluorine containing organic or inorganic group, $R^8$ is H, any of the substituents defined for $R^4$, or an N,N'-cycloalkyl-substituted naphthalene-1,4,5,8-bis-carboximide moiety in which one of the imide nitrogen groups in the $R^8$ group is the point of attachment to the cyclohexyl group either directly or indirectly to provide a bis compounds based on a central moiety that is disubstituted with two N,N'- cycloalkyl-substituted naphthalene-1,4,5,8-bis-carboximide moieties, the Y groups are independently alkyl, alkenyl, alkoxy, aryl, or arylalkyl groups, halogens, cyano, fluorine-containing groups, carbonyl-containing or carboxy-containing groups, and m is an integer of from 0 to 2, and the naphthalene diimide is present in an amount of at least 50 and up to and including 95 weight %, based on the total organic semiconducting composition weight.

2. The composition of claim 1 wherein the polymer additive comprises one or more of the following polymers having the listed low frequency (1000 Hz) permittivity:

| | |
|---|---|
| Polystyrene | 2.5 |
| Poly(α-methylstyrene) | 2.6 |
| Poly(α-vinyl naphthalene) | 2.6 |
| Poly(vinyl toluene) | 2.6 |
| Polyethylene | 2.2-2.3 |
| cis-Polybutadiene | 2.0 |
| Polypropylene | 2.2 |
| Polyisoprene | 2.3 |
| Poly(4-methyl-1-pentene) | 2.1 |
| Poly(4-methylstyrene) | 2.7 |
| Poly(chorotrifluoroethylene) | 2.3-2.8 |
| Poly(2-methyl-1,3-butadiene) | 2.4 |
| Poly(p-xylylene) | 2.6 |
| Poly(α-α-α'-α' tetrafluoro-p-xylylene) | 2.4 |
| Poly[1,1-(2-methyl propane)bis(4-phenyl)carbonate] | 2.3 |
| Poly(cyclohexyl methacrylate) | 2.5 |
| Poly(chlorostyrene) | 2.6 |
| Poly(2,6-dimethyl-1,4-phenylene ether) | 2.6 |
| Polyisobutylene | 2.2 |
| Poly(vinyl cyclohexane) | 2.2 |
| Poly(vinyl cinnamate) | 2.9 |
| Poly(4-vinyl biphenyl) | 2.7 |
| Poly(methyl methacrylate) | 3.1-3.5. |

3. The composition of claim 1 wherein the naphthalene diimide have a lowest unoccupied molecular orbital energy level of from about 3.5 eV to about 4.6 eV with reference to the vacuum energy level.

4. The composition of claim 1 wherein the naphthalene diimide is present in an amount of at least 75 and up to and including 95 weight %, based on the total composition solids.

5. A thin-film, field-effect transistor comprising a dielectric layer, a gate electrode, a source electrode, a thin film of an organic semiconducting composition of claim 1, and a drain electrode, wherein the dielectric layer, the gate electrode, the thin film of organic semiconductor material, source electrode, and the drain electrode are in any sequence as long as the gate electrode and thin film of the organic semiconducting composition both contact the dielectric layer, and the source electrode and the drain electrode both contact the thin film of the organic semiconducting composition.

6. The transistor of claim 5 wherein the thin film of the organic semiconducting composition is capable of exhibiting a field electron mobility greater than 0.1 cm$^2$/V·sec.

7. The transistor of claim 5 that has an on/off ratio of a source/drain current of at least $10^4$.

8. The transistor of claim 5 wherein the gate electrode is adapted for controlling, by means of a voltage applied to the gate electrode, a current between the source and drain electrodes through the thin film of organic semiconductor material.

9. The transistor of claim 5 wherein the source, drain, and gate electrodes each independently comprise a material selected from doped silicon, metal, and a conducting polymer.

10. An electronic device selected from the group consisting of integrated circuits, active-matrix display, and solar cells comprising a multiplicity of thin-film transistors according to claim 5.

11. The electronic device of claim 10 wherein the multiplicity of the thin-film transistors is on a non-participating support that is optionally flexible.

12. An article comprising a support having disposed thereon a dry organic semiconducting layer consisting essentially of an N,N-dicycloalkyl-substituted naphthalene diimide and a polymer additive comprising an insulating or semiconducting polymer, wherein the organic semiconducting layer is capable of exhibiting a field electron mobility greater than 0.001 cm$^2$/V·sec, the polymer additive has a permittivity at 1000 Hz of from 2 to 4, at least 95 weight % of its atoms are hydrogen, fluorine, and carbon atoms, and is a styrenic polymer, polyalkylene, poly(meth)acrylate, polyalkene, polynaphthalene, polycycloalkyl, or combinations thereof, and the polymer additive is present in an amount of at least 5 and up to and including 25 weight %, based on total layer weight, and the naphthalene diimide is represented by any of the following Structures (IIIa), (IIIb), (IVa), and (IVb):

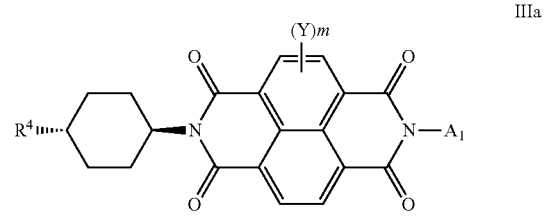

IIIa

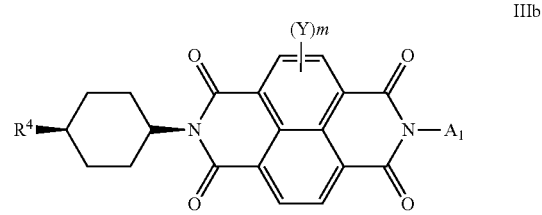

IIIb

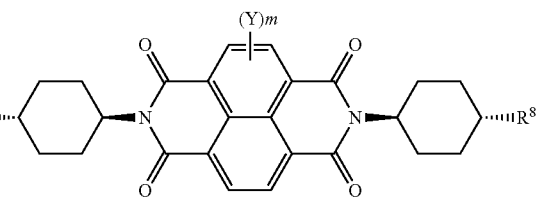

IVa

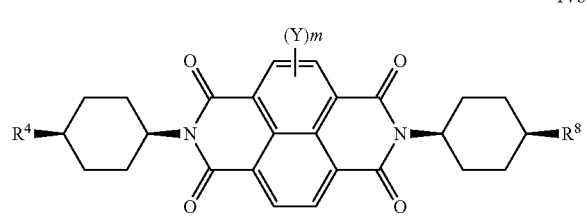

IVb wherein $R^4$ is a $C_1$-$C_{12}$ alkyl group, $C_2$-$C_8$ alkylene group, substituted phenyl or cyclohexyl group, $C_1$-$C_8$ alkoxy group, $C_1$-$C_8$ carbonyl, carboxy substituent, carbonyl-containing substituent, fluorine, or fluorine containing organic or inorganic group, $R^8$ is H, any of the substituents defined for $R^4$, or an N,N'-cycloalkyl-substituted naphthalene-1,4,5,8-bis-carboximide moiety in which one of the imide nitrogen groups in the $R^8$ group is the point of attachment to the cyclohexyl group either directly or indirectly to provide a bis compounds based on a central moiety that is disubstituted with two N,N'-cycloalkyl-substituted naphthalene-1,4,5,8-bis-carboximide moieties, the Y groups are independently alkyl, alkenyl, alkoxy, aryl, or arylalkyl groups, halogens, cyano, fluorine-containing groups, carbonyl-containing or carboxy-containing groups, and m is an integer of from 0 to 2, and the naphthalene diimide is present in an amount of at least 75 and up to and including 95 weight %, based on the total layer weight.

* * * * *